(12) United States Patent
Liaw

(10) Patent No.: US 12,464,804 B2
(45) Date of Patent: Nov. 4, 2025

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventor: Jhon-Jhy Liaw, Zhudong Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 669 days.

(21) Appl. No.: 17/860,312

(22) Filed: Jul. 8, 2022

(65) Prior Publication Data

US 2024/0014280 A1 Jan. 11, 2024

(51) Int. Cl.
*H10D 84/01* (2025.01)
*H10D 30/00* (2025.01)
*H10D 30/01* (2025.01)
*H10D 62/10* (2025.01)
*H10D 64/01* (2025.01)
*H10D 84/85* (2025.01)
*H10D 84/03* (2025.01)

(52) U.S. Cl.
CPC ..... *H10D 84/0184* (2025.01); *H10D 30/0195* (2025.01); *H10D 30/508* (2025.01); *H10D 62/121* (2025.01); *H10D 64/017* (2025.01); *H10D 64/021* (2025.01); *H10D 84/0177* (2025.01); *H10D 84/851* (2025.01); *H10D 84/0167* (2025.01); *H10D 84/017* (2025.01); *H10D 84/0186* (2025.01); *H10D 84/038* (2025.01); *H10D 84/85* (2025.01)

(58) Field of Classification Search
CPC ............ H10D 30/508; H10D 30/0195; H10D 64/021; H10D 62/121; H10D 84/851; H10D 84/0184; H10D 84/0177
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2019/0371888 A1* | 12/2019 | Zhang | H10D 62/121 |
| 2020/0411641 A1* | 12/2020 | Noh | H10D 62/121 |
| 2021/0066506 A1* | 3/2021 | Liaw | H10D 64/017 |
| 2021/0242327 A1* | 8/2021 | Lin | H10D 64/021 |

* cited by examiner

*Primary Examiner* — Peter M Albrecht
(74) *Attorney, Agent, or Firm* — Cooper Legal Group, LLC

(57) ABSTRACT

A semiconductor structure is provided. The semiconductor structure includes a first set of nanostructures that are stacked vertically and spaced apart from one another and formed in a first well, a source/drain feature adjoining the first set of nanostructures, a first top gate electrode layer above a topmost nanostructure in the first set of nanostructures, and an inner gate electrode layer sandwiched between the nanostructures. A first dimension of the inner gate electrode layer in a first direction is greater than a second dimension of the first top gate electrode layer in the first direction.

20 Claims, 29 Drawing Sheets

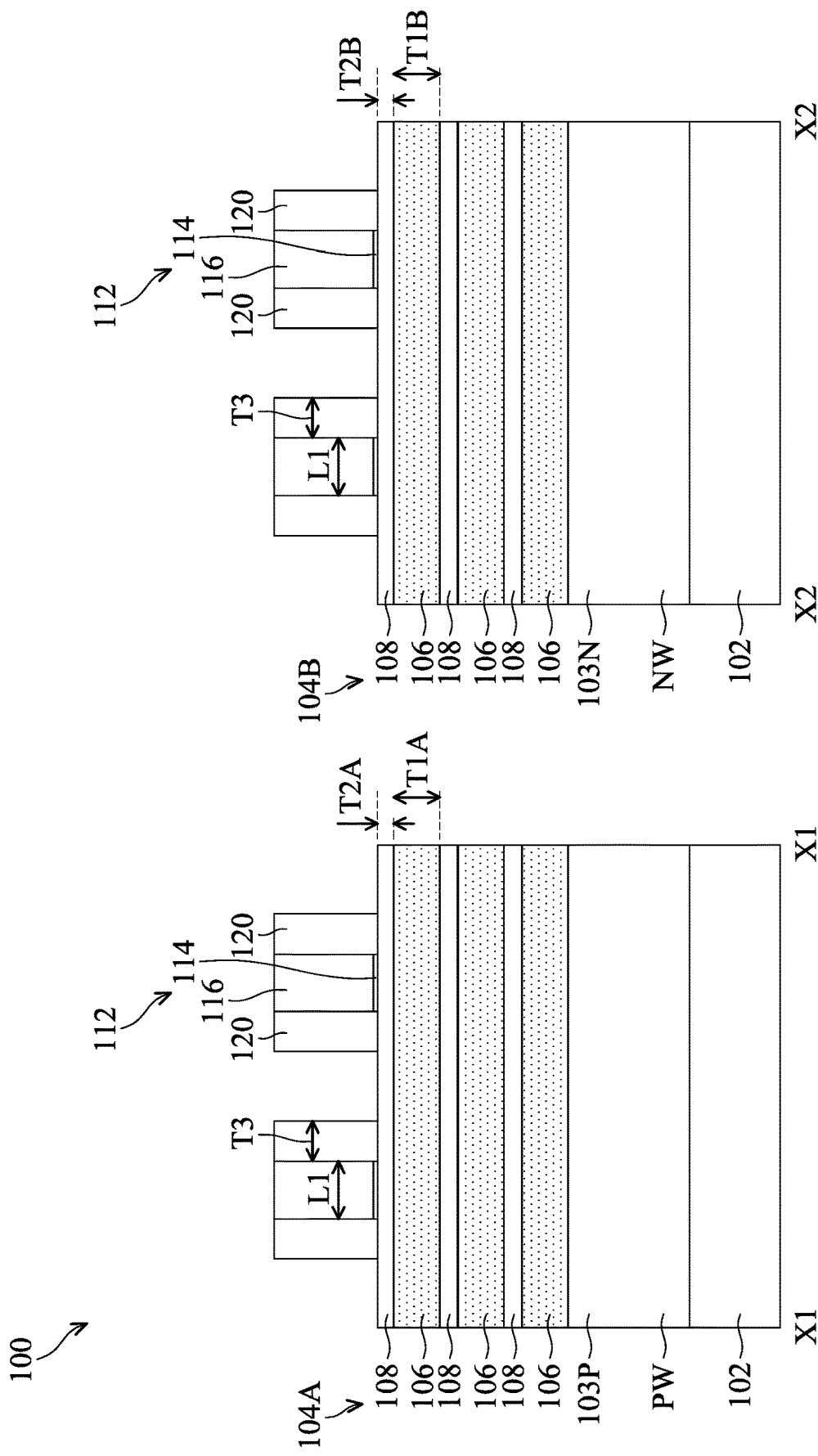

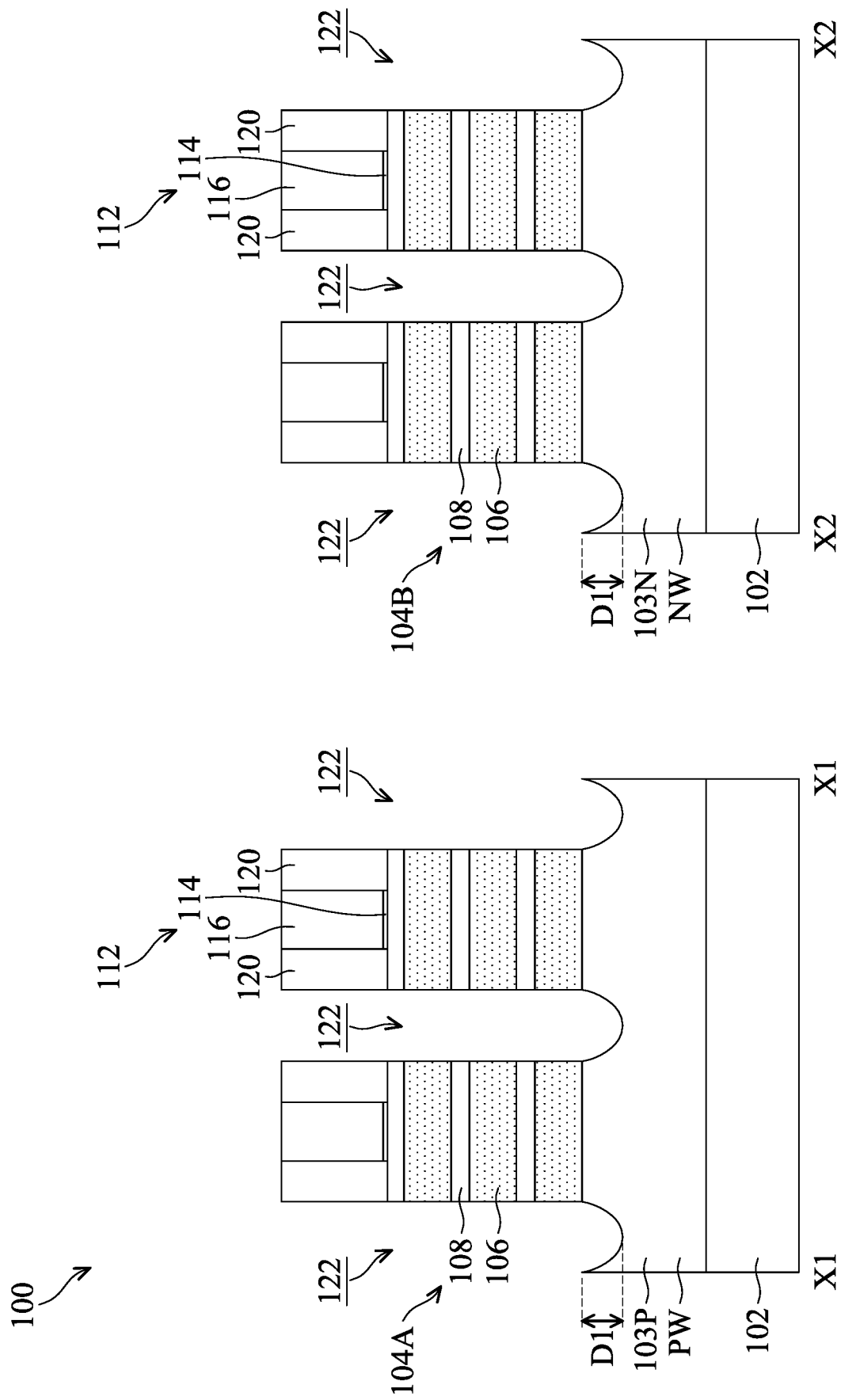

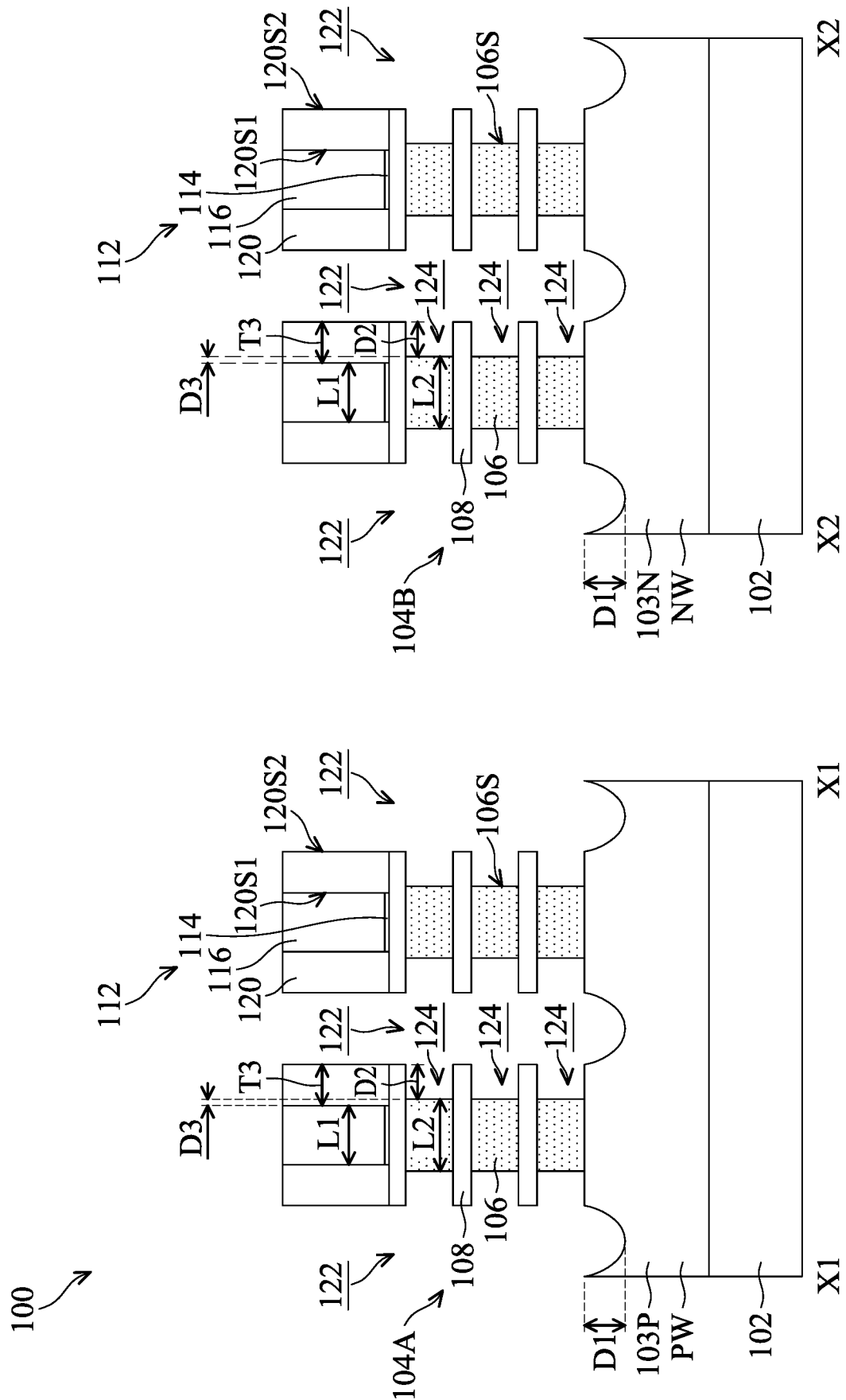

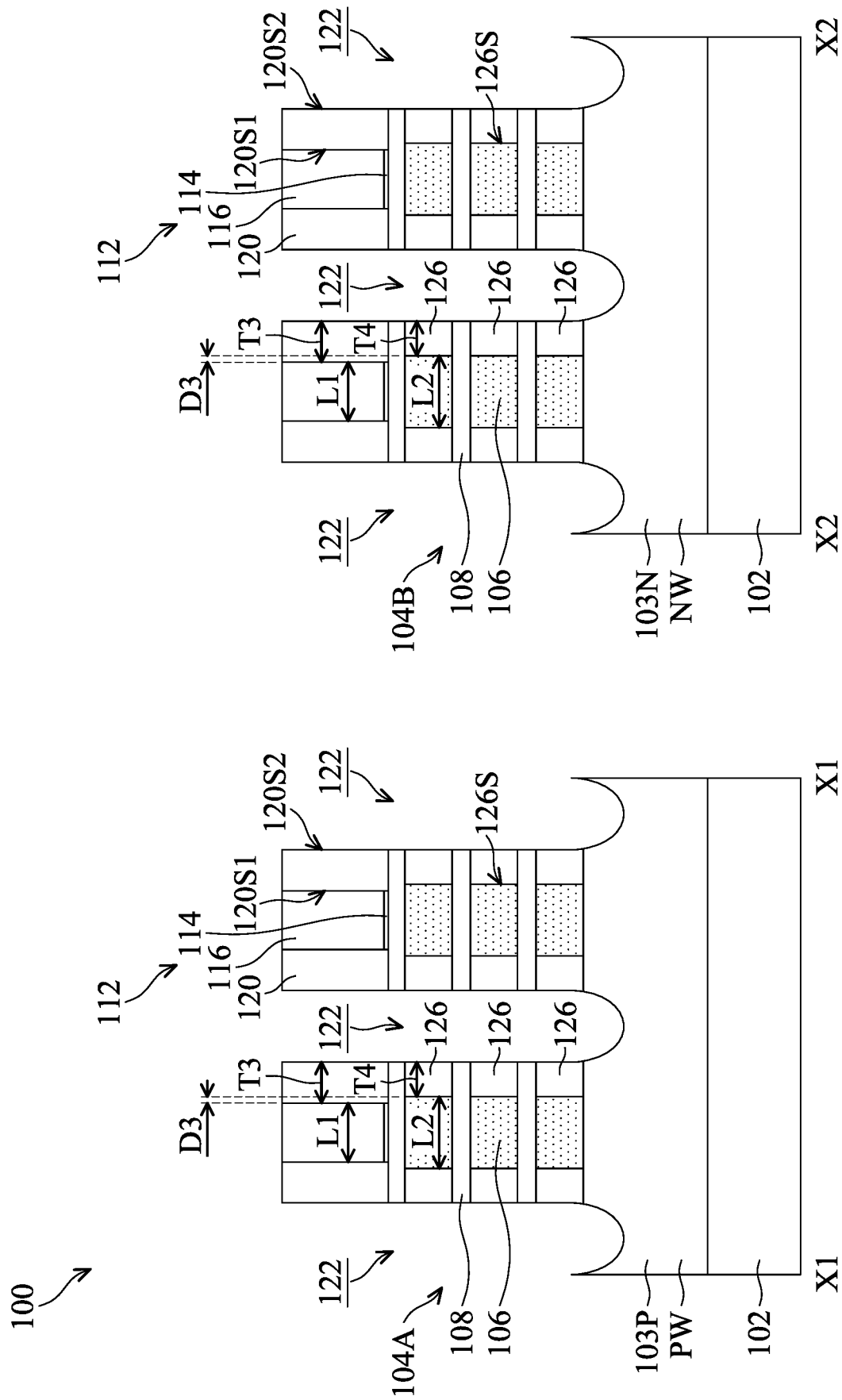

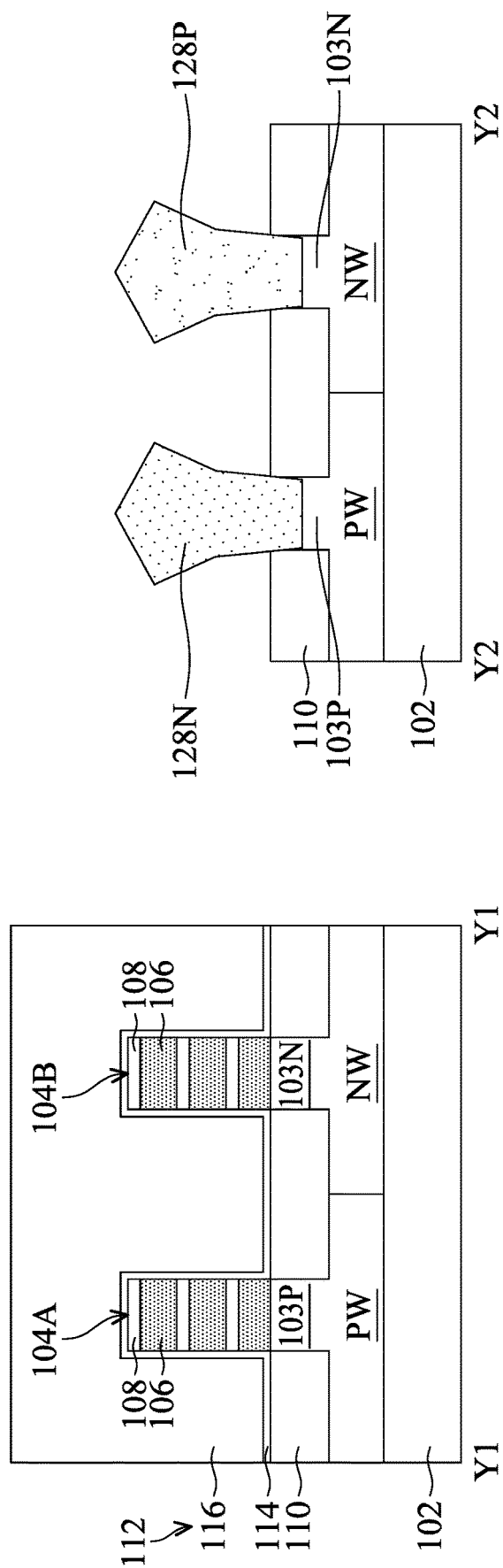

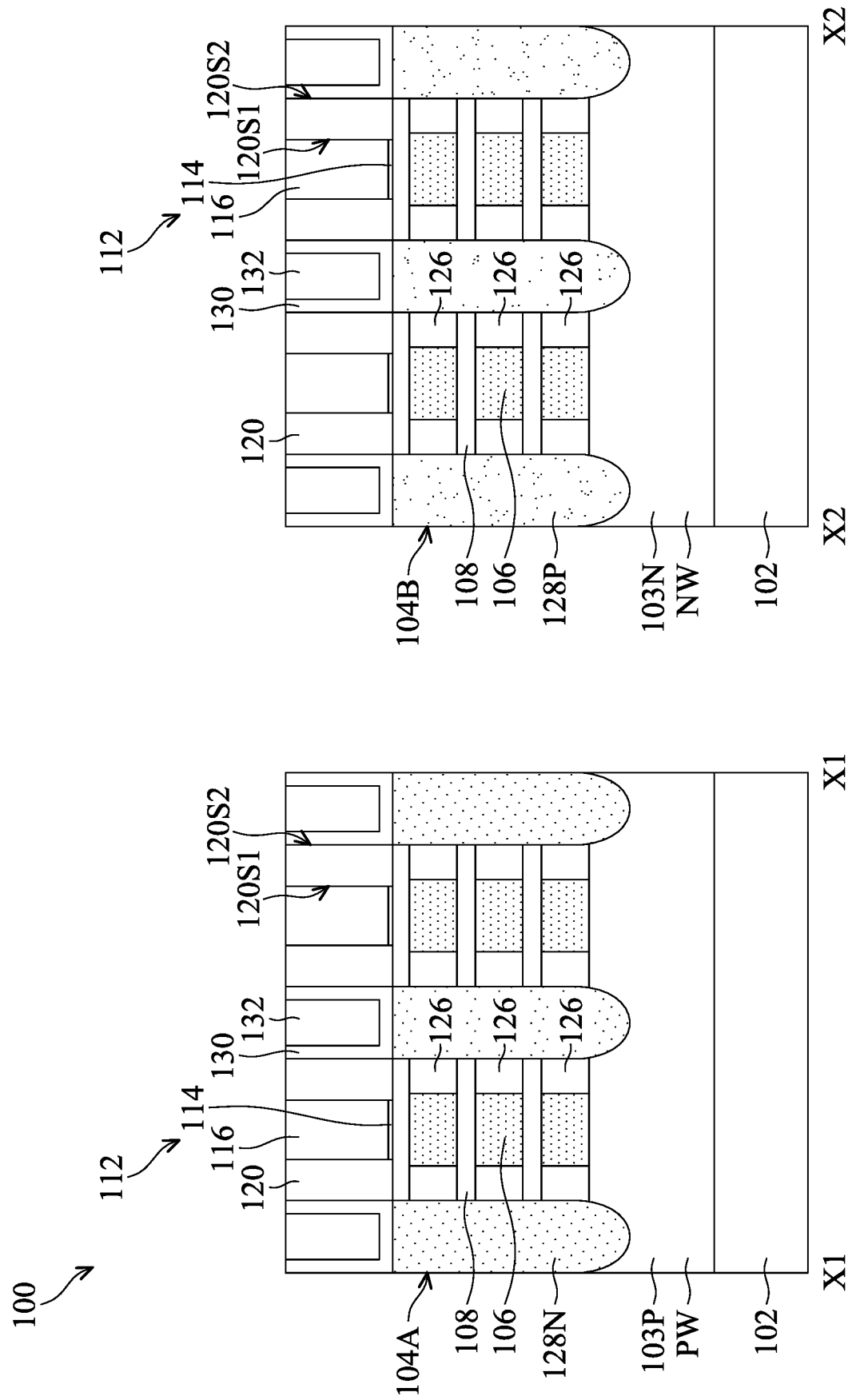

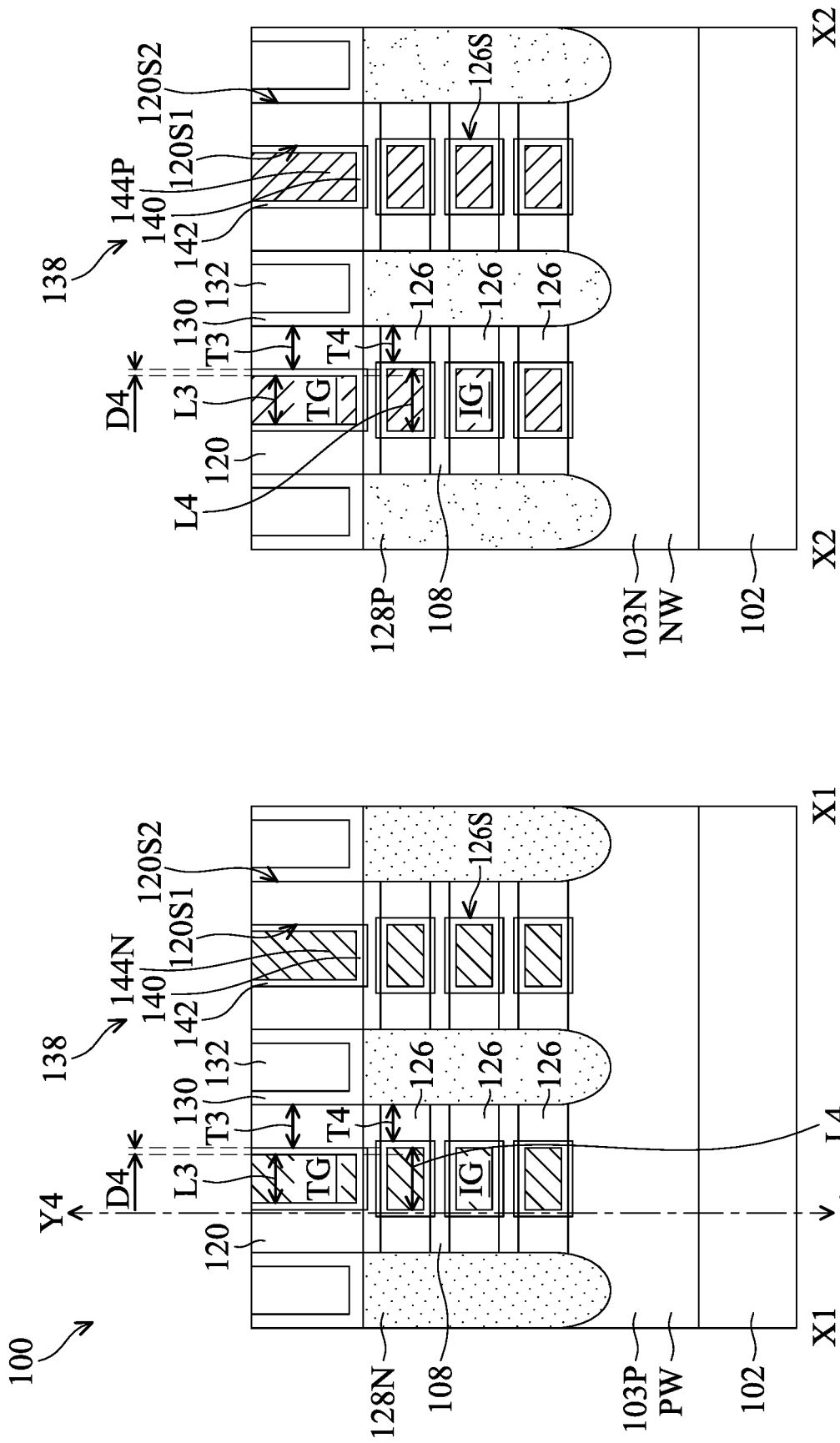

SEMICONDUCTOR STRUCTURE AND METHOD FOR FORMING THE SAME

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure, which can extend around the channel region and provide access to the channel on two or four sides. GAA devices are compatible with conventional complementary metal-oxide-semiconductor (CMOS) processes, and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 3A-1, 3A-2, 3A-3, 3A-4 and 3A-5, 3B-1, 3B-2, 3B-3 and 3B-4, 3C-1, 3C-2, 3C-3, 3C-4 and 3C-5, 3D-1, 3D-2, 3D-3, 3D-4 and 3D-5, 3E-1, 3E-2, 3E-3 and 3E-4, 3F-1, 3F-2, 3F-3 and 3F-4, 3G-1, 3G-2, 3G-3, 3G-4, 3G-5 and 3G-6, 3H-1, 3H-2, 3H-3, 3H-4, 3H-5 and 3H-6, and 3I-1, 3I-2, 3I-3, 3I-4 and 3I-5 are cross-sectional views illustrating the formation of a semiconductor structure at various intermediate stages, in accordance with some embodiments of the disclosure.

FIGS. 4-1, 4-2, 4-3 and 4-4 are a modification of the semiconductor structure of FIGS. 3I-1, 3I-2, 3I-3 and 3I-5, in accordance with some embodiments of the disclosure.

DETAILED DESCRIPTION

Figure 1:
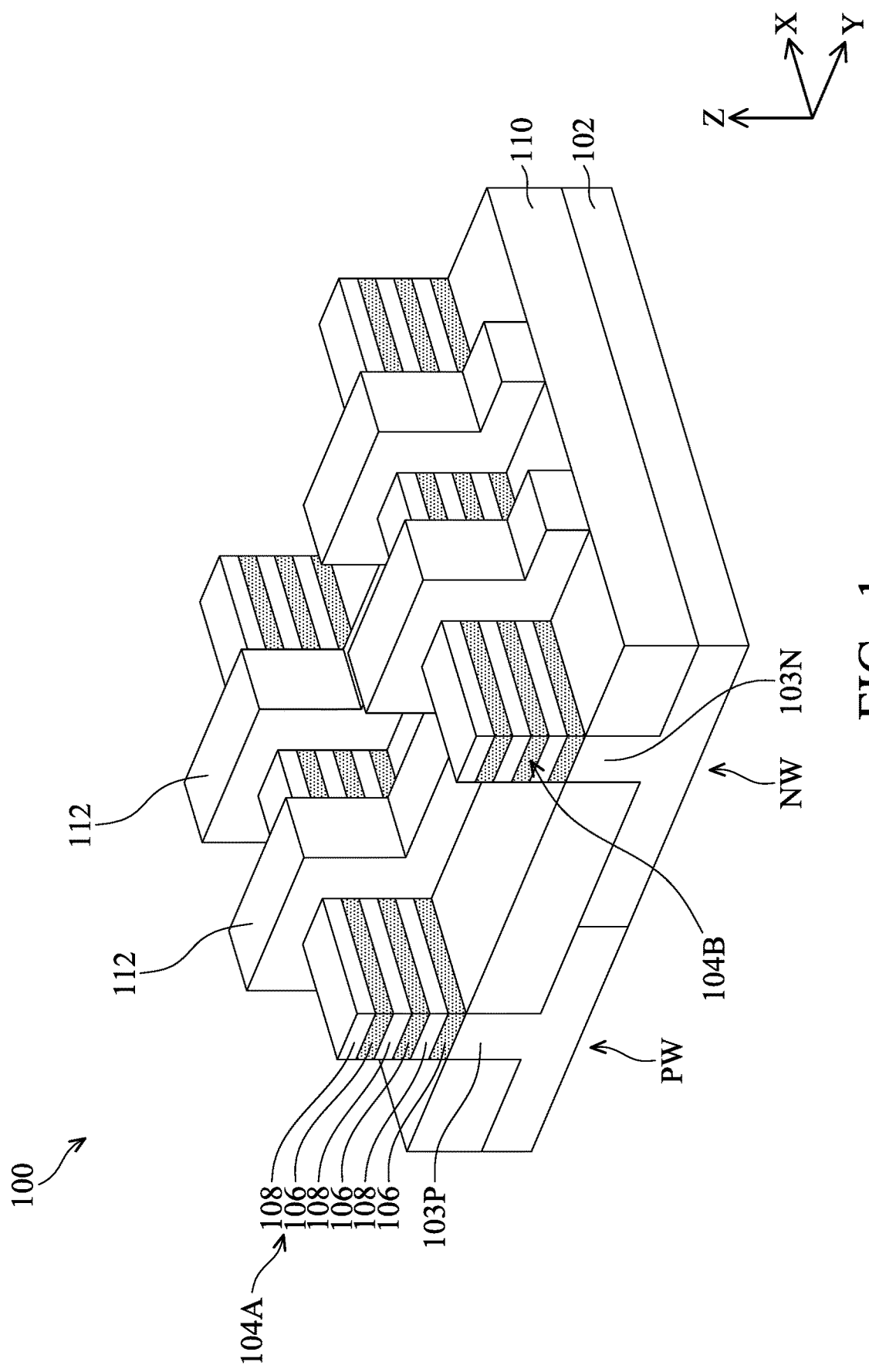
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of a semiconductor structure are provided. The aspect of the present disclosure is directed to a semiconductor structure including nanostructure transistors. The semiconductor structure includes a set of nanostructures, a top gate electrode layer above the topmost nanostructure, and an inner gate electrode layer between the nanostructures, in accordance with some embodiments. The gate length of the top gate electrode layer is shorter than the gate length of the inner gate electrode layer, in accordance with some embodiments. As a result, the top gate electrode layers have a relatively short gate length, which may improve the density of components of the semiconductor devices. The inner gate electrode layers have a relatively long gate length, which may enhance the performance of the resulting semiconductor device, e.g., lower gate leakage, and/or lower off-state current (Isoff).

FIG. 1 is a perspective view of a semiconductor structure 100, in accordance with some embodiments of the disclosure.

The semiconductor structure 100 includes a substrate 102 and fin structures 104 (including 104A and 104B) over the substrate 102, as shown in FIG. 1, in accordance with some embodiments. The substrate 102 includes a p-type well PW and an n-type well NW immediately adjacent to the p-type well PW, in accordance with some embodiments. The fin structure 104A is formed in the p-type well PW of the substrate 102, and the fin structure 104B is formed in the n-type well NW of the substrate 102, in accordance with some embodiments. The fin structures 104A and 104B are the active regions of the semiconductor structure 100, in accordance with some embodiments.

For a better understanding of the semiconductor structure 100, the X-Y-Z coordinate reference is provided in the figures of the present disclosure. The X-axis and the Y-axis are generally orientated along the lateral (or horizontal) directions that are parallel to the main surface of the substrate 102. The Y-axis is transverse (e.g., substantially perpendicular) to the X-axis. The Z-axis is generally oriented along the vertical direction that is perpendicular to the main surface of the substrate 102 (or the X-Y plane).

The fin structure 104A includes a lower fin element 103P formed from the p-type well PW, and the fin structure 104B includes a lower fin element 103N formed from the n-type well NW, in accordance with some embodiments. The lower fin elements 103P and 103N are surrounded by an isolation structure 110, in accordance with some embodiments. Each of the fin structures 104A and 104B further includes an upper fin element formed from an epitaxial stack including alternating first semiconductor layers 106 and second semiconductor layer 108, in accordance with some embodiments. The second semiconductor layers 108 will form nanostructures (e.g., nanowires or nanosheets) and serve as the channel for the resulting semiconductor devices, in accordance with some embodiments.

The fin structures 104 extend in the X direction, in accordance with some embodiments. That is, the fin structures 104 have longitudinal axes parallel to the X direction, in accordance with some embodiments. The X direction may also be referred to as the channel-extending direction. The current of the resulting semiconductor device (i.e., nanostructure transistor) flows in the X direction through the channel. Each of the fin structures 104 is defined as several channel regions and several source/drain regions, where the channel regions and the source/drain regions are alternately arranged, in accordance with some embodiments. In this disclosure, a source/drain refers to a source and/or a drain. It is noted that in the present disclosure, a source and a drain are interchangeably used and the structures thereof are substantially the same. Gate structures 112 are formed with longitudinal axes parallel to the Y direction and extending across and/or surrounding the channel regions of the fin structures 104A and 104B, in accordance with some embodiments. The source/drain regions of the fin structures 104A and 104B are exposed from the gate structures 112, in accordance with some embodiments. The Y direction may also be referred to as a gate-extending direction.

Although two fin structures 104 are illustrated in FIG. 1, the semiconductor structure 100 may include more than two fin structures 104. In addition, FIG. 1 shows two gate structures 112 (or channel regions) for illustrative purposes and is not intended to be limiting. The number of fin structures and the gate structures may be dependent on design demand of an integrated circuit and/or performance consideration of semiconductor devices.

Figure 2:
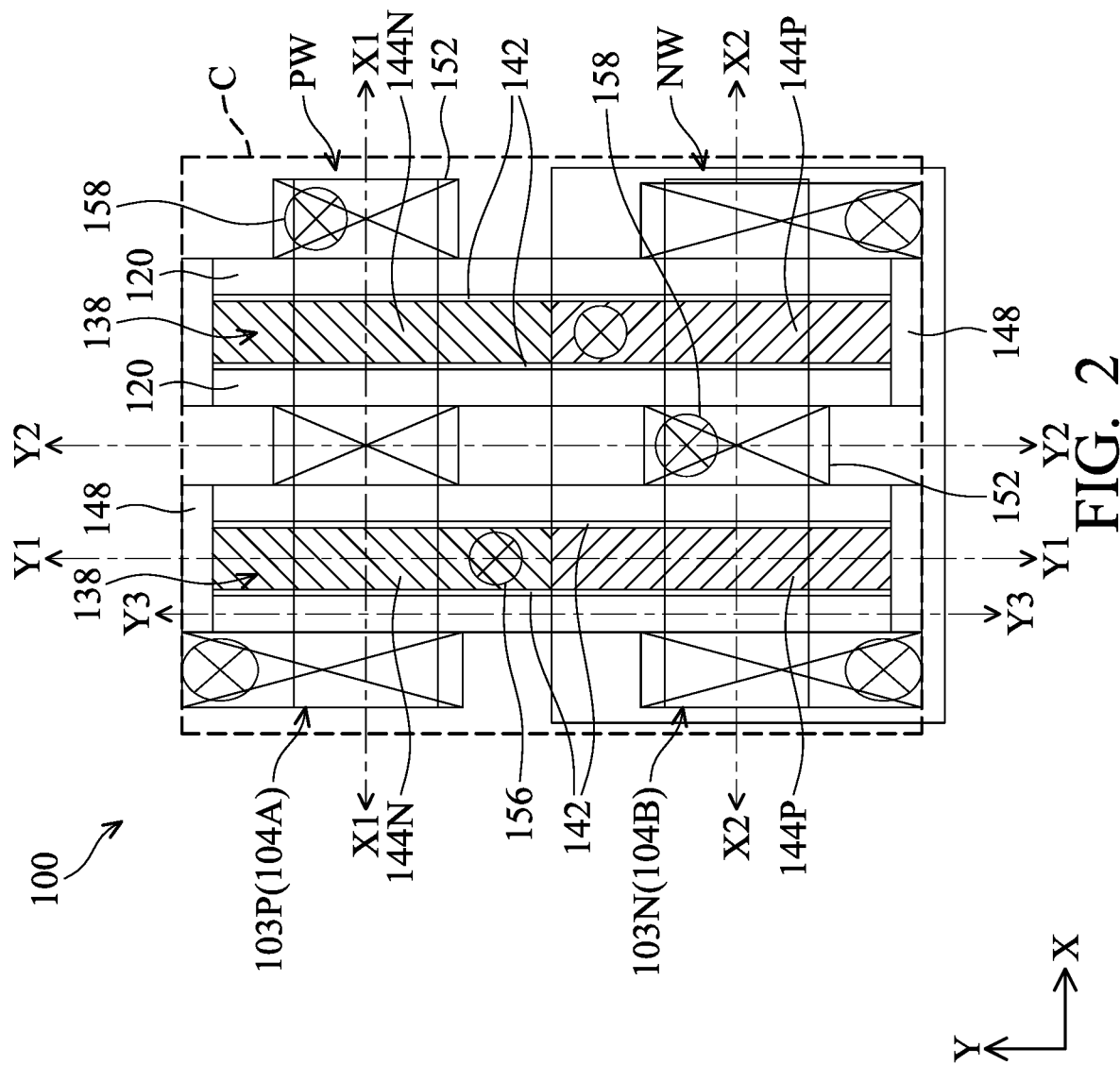
FIG. 2 is a layout of a semiconductor structure, in accordance with some embodiments.

FIG. 2 is a layout (or a plan view) of a semiconductor structure 100, in accordance with some embodiments. FIG. 2 illustrates a semiconductor structure 100 which may be or include nanostructure devices (e.g., GAA FETs), in accordance with some embodiments.

The semiconductor structure 100 includes active regions 104 (including 104A and 104B) over a substrate (as shown in FIG. 1), and final gate stacks 138 across the active regions 104, in accordance with some embodiments. The substrate includes a p-type well PW and an n-type well NW, in accordance with some embodiments. The p-type well PW and the n-type well NW are immediately arranged in the Y direction, in accordance with some embodiments. The active region 104A is located on the p-type well PW, and the active region 104B is located on the n-type well NW, in accordance with some embodiments. Each of the active regions 104 includes a lower fin element 103P (or 103N) and nanostructures (not shown in FIG. 2) formed over the lower element 103P (or 103N), in accordance with some embodiments.

The final gate stacks 138 extend across the active regions 104 and wrap around the nanostructures 108 of the active regions 104, in accordance with some embodiments. In some embodiments, each of the final gate stacks 138 includes a gate dielectric layer 142 and work function metal materials 144 (including 144N and 144P). The work function metal material 144N is formed in the p-type well PW and the work function metal material 144P is formed in the n-type well NW, in accordance with some embodiments. Gate spacer layers 120 are formed along the opposite sides of the final gate stacks 138, in accordance with some embodiments.

The final gate stacks 138 are combined with the nanostructures of the active regions 104 to form nanostructure transistors, in accordance with some embodiments. The nanostructure transistors are formed at the cross points between the active regions 104 and the final gate stacks 138, in accordance with some embodiments. The nanostructure transistors which are formed over the p-type well PW are n-channel transistors, and the nanostructure transistors which are formed over the n-type well NW are p-channel transistors.

The semiconductor structure 100 may be used to form an integrated circuit which includes several functional circuits interconnected with each other, in accordance with some embodiments. FIG. 2 illustrates a region of the semiconductor structure 100 (or the substrate) which is defined as a cell region C, in accordance with some embodiments. A functional circuit including four nanostructure transistors (formed from the active regions 104 and the final gate stacks 138) is disposed in the cell region C, in accordance with some embodiments. The boundaries (or edges) of the cell region C are dictated as dashed lines. The cell region C may have rectangular shapes in the plan view, and the edges of the cell region C extend in the X direction and the Y direction, in accordance with some embodiments.

Gate isolation structures 148 are formed in and/or through the final gate stacks 138 and the gate spacer layers 120, in accordance with some embodiments. The gate isolation structures 148 are located on the boundaries of the cell region C with respect to the Y direction (extending in the X direction), in accordance with some embodiments.

Contact plugs 152 are formed over the source/drain regions of the active regions 104A and 104B, in accordance with some embodiments. The contact plugs 152 are electrically connected to the source or drain terminals of the nanostructure transistors, in accordance with some embodiments. Vias 156 are formed on and electrically connected to the work function metal materials 144N and 144P of the final gate stacks 138, in accordance with some embodiments. Vias 158 are formed on and electrically connected to the contact plugs 152, in accordance with some embodiments.

FIG. 2 further illustrates reference cross-sections that are used in later figures. Cross-section X1-X1 is in a plane parallel to the longitudinal axis (X direction) of the fin structure 104A and through the fin structure 104A, in accordance with some embodiments. Cross-section X2-X2 is in a plane parallel to the longitudinal axis (X direction) of the fin structure 104B and through the fin structure 104B, in accordance with some embodiments. Cross-section Y1-Y1 is in a plane parallel to the longitudinal axis (Y direction) of the final gate stack 138 and through the final gate stack 138 (or a dummy gate structure), in accordance with some embodiments. Cross-section Y2-Y2 is in a plane parallel to the longitudinal axis (Y direction) of the final gate stack 138 and across the source/drain regions SD of the fin structures 104, in accordance with some embodiments. Cross-section Y3-Y3 is in a plane parallel to the longitudinal axis (Y direction) of the final gate stack 138 and through the gate spacer layer 120, in accordance with some embodiments.

FIGS. 3A-1 through 3I-5 are cross-sectional views illustrating the formation of a semiconductor structure 100 at various intermediate stages, in accordance with some embodiments of the disclosure.

FIGS. 3A-1, 3B-1, 3C-1, 3D-1, 3E-1, 3F-1, 3G-1, 3H-1 and 3I-1 correspond to cross-section X1-X1 shown in FIG. 2. FIGS. 3A-2, 3B-2, 3C-2, 3D-2, 3E-2, 3F-2, 3G-2, 3H-2 and 3I-2 correspond to cross-section X2-X2 shown in FIG. 2. FIGS. 3A-3, 3B-3, 3C-3, 3D-3, 3E-3, 3F-3, 3G-3, 3H-3 and 3I-3 correspond to cross-section Y1-Y1 shown in FIG. 2. FIGS. 3A-4, 3B-4, 3C-4, 3D-4, 3E-4, 3F-4, 3G-4, 3H-4 and 3I-4 correspond to cross-section Y2-Y2 shown in FIG. 2. FIGS. 3A-5, 3C-5, 3D-5, 3G-5, 3H-5 and 3I-5 correspond to cross-section Y3-Y3 shown in FIG. 2.

FIGS. 3A-1 to 3A-5 are cross-sectional views of a semiconductor structure 100 after the formation of fin structures 104 (including 104A and 104B), an isolation structure 110, the dummy gate structures 112 and gate spacer layers 120, in accordance with some embodiments.

A substrate 102 is provided, as shown in FIGS. 3A-1 to 3A-5, in accordance with some embodiments. The substrate 102 may be a portion of a semiconductor wafer, a semiconductor chip (or die), and the like. In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

An N-type well NW and a p-type well PW are formed in the substrate 102, as shown in FIGS. 3A-1 to 3A-5, in accordance with some embodiments. In some embodiments, the n-type well NW and the p-type well PW have different electrically conductive types. In some embodiments, the wells NW and PW are formed by ion implantation processes. For example, a patterned mask layer (such as a photoresist layer and/or a hard mask layer) is formed to cover regions of the substrate 102 where the p-type well is predetermined to be formed, and then n-type dopants (such as phosphorus or arsenic) are implanted into the substrate 102, thereby forming the n-type well NW, in accordance with some embodiments. Afterward, the patterned mask layer may be removed. Similarly, a patterned mask layer (such as photoresist layer and/or hard mask layer) is formed to cover regions of the substrate 102 where the n-type well is predetermined to be formed, and then p-type dopants (such as boron or $BF_2$) are implanted into the substrate 102, thereby forming the p-type well PW, in accordance with some embodiments. Afterward, the patterned mask layer may be removed.

In some embodiments, the respective concentrations of the dopants in the wells NW and PW are in a range from about $10^{16}/cm^{-3}$ to about $10^{18}/cm^{-3}$. In some embodiments, the ion implantation processes may be performed several times with different dosages and different energy intensities. In some embodiments, the ion implantation process may include anti-punch through (APT) implant.

Active regions 104 (including 104A and 104B) are formed over the substrate 102, as shown in FIGS. 3A-1 to 3A-5, in accordance with some embodiments. In some embodiments, the active regions 104A and 104B extend in the X direction. That is, the active regions 104A and 104B have longitudinal axes parallel to the X direction, in accordance with some embodiments. The formation of the active regions 104A and 104B includes forming an epitaxial stack over the substrate 102 using an epitaxial growth process, in accordance with some embodiments. The epitaxial stack includes alternating first semiconductor layers 106 and second semiconductor layers 108, in accordance with some embodiments. The epitaxial growth process may be molecular beam epitaxy (MBE), metal organic chemical vapor deposition (MOCVD), or vapor phase epitaxy (VPE), or another suitable technique.

In some embodiments, the first semiconductor layers 106 are made of a first semiconductor material and the second semiconductor layers 108 are made of a second semiconductor material. The first semiconductor material for the first semiconductor layers 106 has a different lattice constant than the second semiconductor material for the second semiconductor layers 108, in accordance with some embodiments. In some embodiments, the first semiconductor material and the second semiconductor material have different oxidation rates and/or etching selectivity. In some embodiments, the first semiconductor layers 106 are made of SiGe, where the percentage of germanium (Ge) in the SiGe is in a range from about 20 atomic % to about 50 atomic %, and the second semiconductor layers 108 are made of pure or substantially pure silicon. In some embodiments, the first semiconductor layers 106 are $Si_{1-x}Ge_x$, where x is more than about 0.3, or Ge (x=1.0) and the second semiconductor layers 108 are Si or $Si_{1-y}Ge_y$, where y is less than about 0.4, and x>y.

In some embodiments, the first semiconductor layers 106 of the active region 104A is pure silicon while the first semiconductor layers 106 of the active region 104B is SiGe. The epitaxial stack in the p-type well PW and the epitaxial stack in the n-type well NW may be formed separately.

The first semiconductor layers 106 are configured as sacrificial layers and will be removed to form gaps to accommodate gate materials, and the second semiconductor layers 108 will form nanostructures (e.g., nanowires or nanosheets) that laterally extend between source/drain features and serve as the channel for the resulting semiconductor devices (such as nanostructure transistors), in accordance with some embodiments.

The formation of the active regions 104A and 104B further includes patterning the epitaxial stack and underlying wells PW and NW using photolithography and etching processes, thereby forming trenches and the active regions 104 protruding from between trenches, in accordance with some embodiments. The portion of the p-type well PW protruding from between the trenches serves as the lower fin element 103P of the active region 104A, and the portion of the n-type well NW protruding from between the trenches serves as the lower fin element 103N of the active region 104B, in accordance with some embodiments. A remainder of the epitaxial stack (including the first semiconductor layers 106 and the second semiconductor layers 108) serves as the upper fin elements of the active regions 104A and 104B, in accordance with some embodiments. In some embodiments, the active regions 104A and 104B are the fin structures 104A and 104B as shown in FIG. 1.

In some embodiments, the thickness TA1 of each of the first semiconductor layers 106 of the active region 104A is in a range from about 6 nm to about 16 nm. In some embodiments, the thickness TA2 of each of the second semiconductor layers 108 of the active region 104A is in a range from about 4 nm to about 8 nm. In some embodiments, the thickness TB1 of each of the first semiconductor layers 106 of the active region 104B is in a range from about 7 nm to about 20 nm. In some embodiments, the thickness TB2 of each of the second semiconductor layers 108 of the active region 104B is in a range from about 3 nm to about 8 nm. In some embodiments, the pitch of the second semiconductor layers 108 (e.g., the sum of TA1 and TA2 or the sum of TB1 and TB2) is in a range from about 10 nm to about 28 nm, e.g., from about 12 nm to about 24 nm. The thickness of the second semiconductor layers 108 may be greater than, equal to, or less than the first semiconductor layers 106, depending on the amount of gate materials to be filled in spaces where the first semiconductor layers 106 are removed. Although three first semiconductor layers 106 and three second semiconductor layers 108 are shown in FIGS. 3A-1 to 3A-5, the number is not limited to three, and can be two or four, and is less than 10.

An isolation structure 110 is formed to surround the lower fin elements 103P and 103N of the active regions 104A and 104B, as shown in FIGS. 3A-3 to 3A-5, in accordance with some embodiments. The isolation structure 110 is configured to electrically isolate active regions the active regions 104 of the semiconductor structure 100 and is also referred to as shallow trench isolation (STI) feature, in accordance with some embodiments. The formation of the isolation structure 110 includes forming an insulating material to overfill the trenches, in accordance with some embodiments. In some embodiments, the insulating material is made of silicon oxide ($SiO_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof. In some embodiments, the insulating material is deposited using CVD (such as flowable CVD (FCVD), low-pressure CVD (LPCVD), plasma-enhanced CVD (PECVD), high density plasma CVD (HDP-CVD), or high aspect ratio process (HARP)), atomic layer deposition (ALD), another suitable technique, or a combination thereof.

A planarization process is performed on the insulating material to remove a portion of the insulating material above the active regions 104, in accordance with some embodiments. The planarization may be chemical mechanical polishing (CMP), etching back process, or a combination thereof. The insulating material is then recessed by an etching process (such as dry plasma etching and/or wet chemical etching) until the upper fin elements of the active regions 104 are exposed, in accordance with some embodiments. The recessed insulating material serves as the isolation structure 110, in accordance with some embodiments.

Figures 3, 3A, 4:
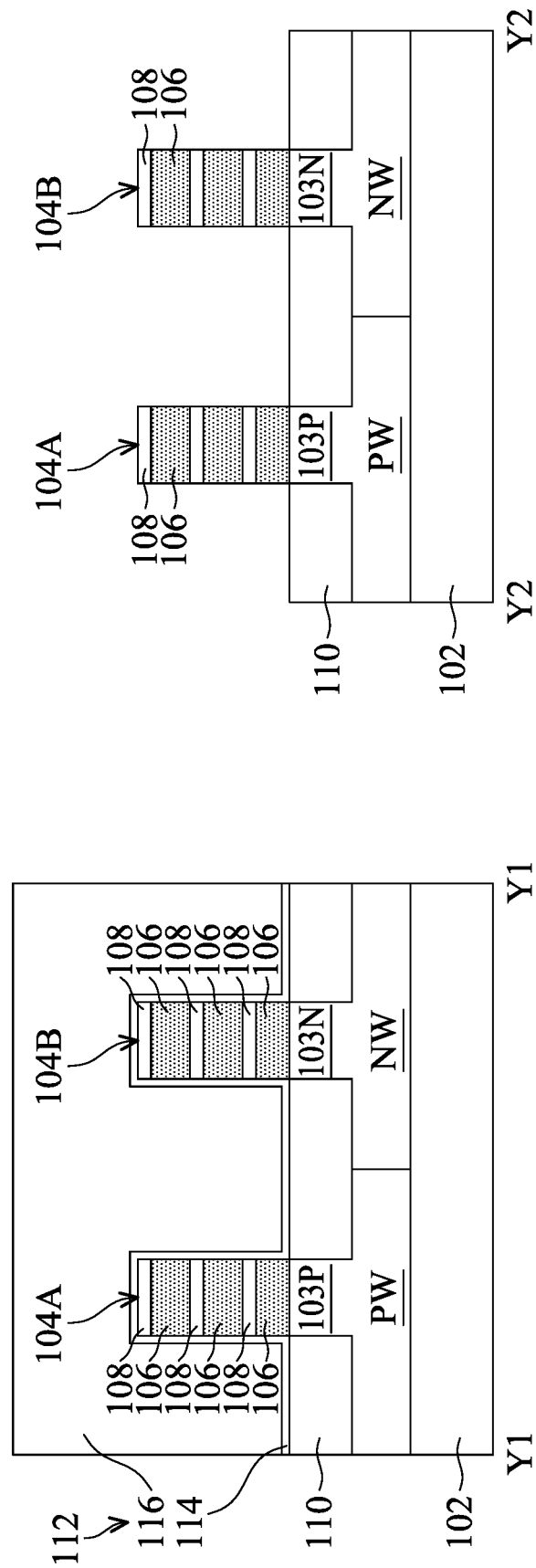
Figures 3, 3A, 4, 5:
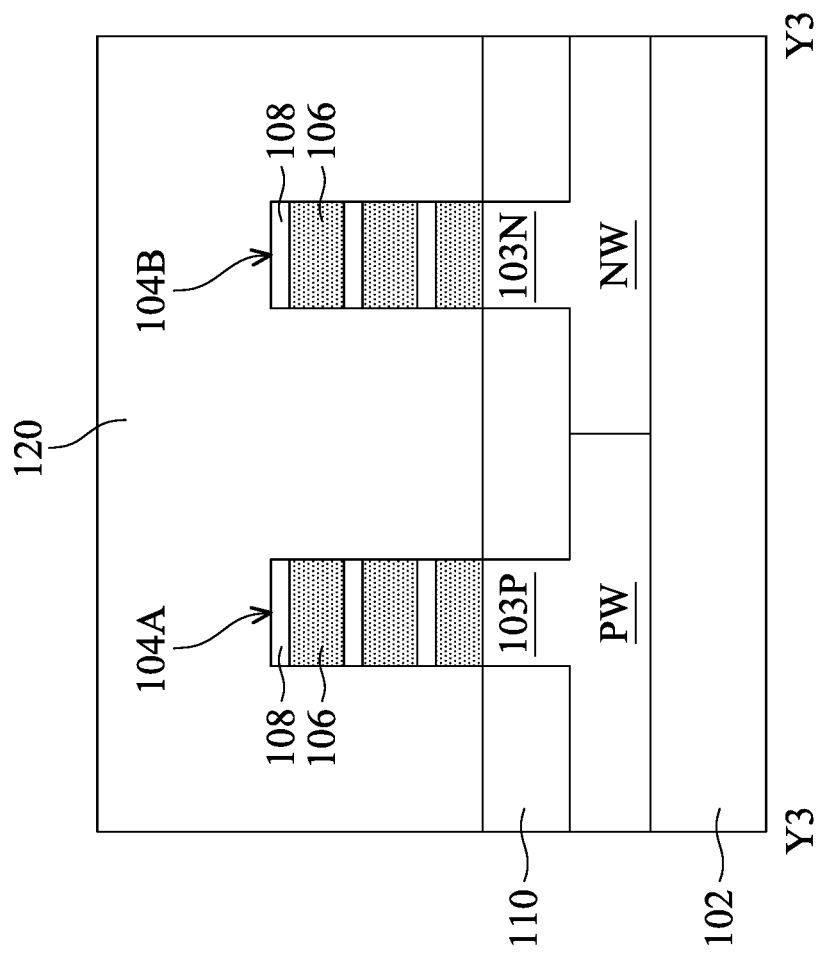

Dummy gate structures 112 are formed across the active regions 104, as shown in FIGS. 3A-1 to 3A-3. The dummy gate structures 112 are configured as sacrificial structures and will be replaced with the final gate stacks, in accordance with some embodiments. In some embodiments, the dummy gate structures 112 extend in the Y direction. That is, the dummy gate structures 112 have longitudinal axes parallel to the Y direction, in accordance with some embodiments. The dummy gate structures 112 surround the channel regions of the active regions 104, in accordance with some embodiments. The dummy gate structures 112 may be similar to the gate structures 112 shown in FIG. 1.

Each of the dummy gate structures 112 includes a dummy gate dielectric layer 114 and a dummy gate electrode layer 116 over the dummy gate dielectric layer, in accordance with some embodiments. In some embodiments, the dummy gate dielectric layer 114 is conformally formed along the upper fin elements of the active regions 104. In some embodiments, the dummy gate dielectric layer 114 is made of one or more dielectric materials, such as silicon oxide (SiO), silicon nitride (SiN), silicon oxynitride (SiON), $HfO_2$, HfZrO, HfSiO, HfTiO, HfAlO. In some embodiments, the dielectric material is deposited using ALD, CVD, thermal oxidation, physical vapor deposition (PVD), another suitable technique, or a combination thereof. In some embodiments, the dummy gate electrode layer 116 is made of semiconductor material such as polysilicon or poly-silicon germanium. In some embodiments, the material for the dummy gate electrode layer 116 is deposited using CVD, ALD, another suitable technique, or a combination thereof.

In some embodiments, the formation of the dummy gate structure 112 includes globally and conformally depositing a dielectric material for the dummy gate dielectric layer 114 over the semiconductor structure 100, depositing a material for the dummy gate electrode layer 116 over the dielectric material, planarizing the material for the dummy gate electrode layer 116, and patterning the material for the dummy gate electrode layer 116 and the dielectric material into the dummy gate structures 112. The patterning process includes forming a patterned hard mask layer (not shown) over the material for the dummy gate electrode layer 116, in accordance with some embodiments. The hard mask layer corresponds to and overlaps the channel region of the active regions 104, in accordance with some embodiments. The materials for dummy gate dielectric layer 114 and the dummy gate electrode layer 116, uncovered by the patterned hard mask layer, are etched away until the source/drain regions of the active regions 104 are exposed, in accordance with some embodiments. In some embodiments, the dummy gate electrode layer 116 has a length L1 (e.g., the dimension in the X direction). In some embodiments, the length L1 is in a range from 5.5 nm to about 23 nm. In some embodiments, the length L1 of the dummy gate electrode layer 116 may be the minimum critical dimension (CD) of the semiconductor components in the semiconductor manufacturing process.

Gate spacer layers 120 are formed over the semiconductor structure 100, as shown in FIGS. 3A-1, 3A-2 and 3A-5, in accordance with some embodiments. The gate spacer layers 120 extend along, and cover, the opposite sides of the dummy gate structures 112, in accordance with some embodiments. In some embodiments, the gate spacer layers 120 extend in the Y direction. That is, the gate spacer layers 120 have a longitudinal axis parallel to the Y direction, in accordance with some embodiments. The gate spacer layers 120 are used to offset the subsequently formed source/drain features and separate the source/drain features from the gate structure, in accordance with some embodiments. The gate spacer layers 120 may be also referred to as top spacer layers.

In some embodiments, the gate spacer layers 120 are made of a dielectric material, such as silicon oxide ($SiO_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof, or a combination thereof. In some embodiments, the gate spacer layers 120 are made of low-k dielectric materials. For example, the dielectric constant (k) values of the gate spacer layers 120 may be lower than a k-value of silicon oxide (SiO), such as lower than 4.2, equal to or lower than about 3.9, such as in a range from about 3.5 to about 3.9.

In some embodiments, the formation of the gate spacer layers 120 includes conformally depositing dielectric materials for the gate spacer layers 120 over the semiconductor structure 100 followed by an anisotropic etching process (such as dry plasma etching). In some embodiments, the deposition process includes ALD, CVD (such as PECVD, LPCVD or HARP), another suitable technique, or a combination thereof. Vertical portions of the dielectric material left on the sidewalls of the dummy gate structures 112 serve as the gate spacer layers 120, in accordance with some embodiments. In some embodiments, the gate spacer layer 120 has a thickness T3 (in the X direction) along the sidewalls of the dummy gate structures 112. In some embodiments, the thickness T3 is in a range from about 3 nm to about 14 nm.

FIGS. 3B-1 to 3B-4 are cross-sectional views of a semiconductor structure 100 after the formation of source/drain recesses 122, in accordance with some embodiments.

An etching process is performed to recess the source/drain regions of the active regions 104, thereby forming source/drain recesses 122, as shown in FIGS. 3B-1, 3B-2 and 3B-4, in accordance with some embodiments. The etching process may be an anisotropic etching process such as dry plasma etching, an isotropic etching process such as dry chemical etching, remote plasma etching or wet chemical etching, or a combination thereof. The gate spacer layers 120 and the dummy gate structures 112 may serve as etch masks such that the source/drain recesses 122 are formed self-aligned opposite sides of the dummy gate structures 112, in accordance with some embodiments. In some embodiments, the etching process is performed without the need for an additional photolithography process.

Figures 3, 3B, 4:
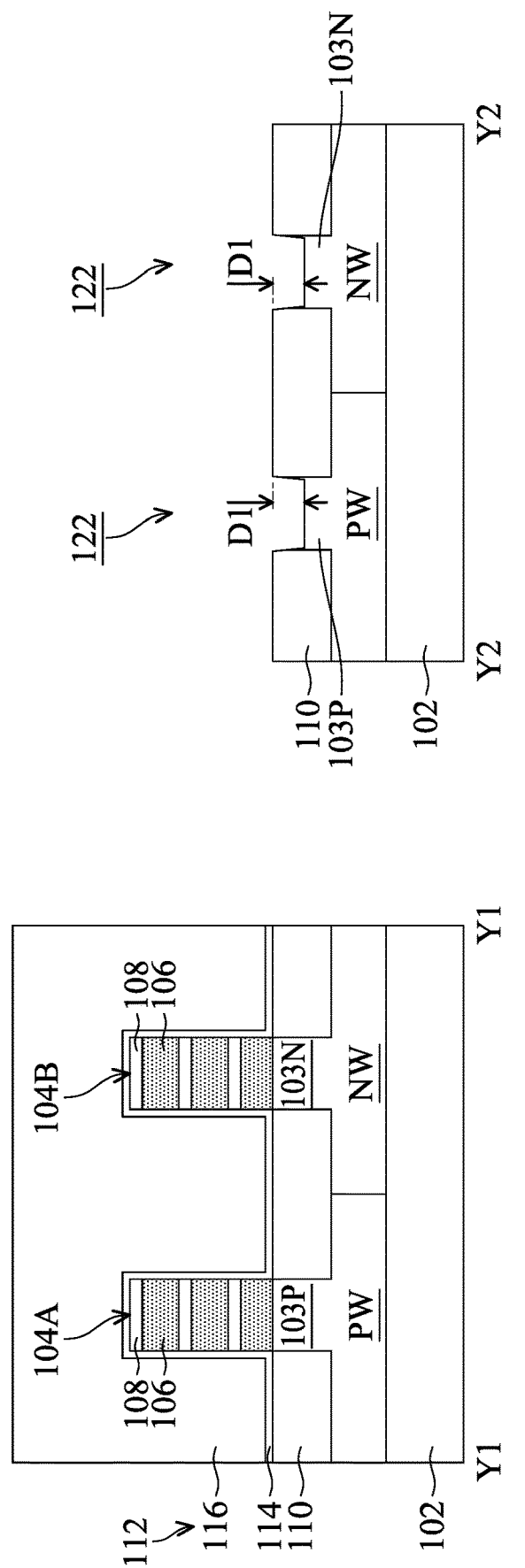

The source/drain recesses 122 extend a distance of D1 into the lower fin elements 103N and 103P, in accordance with some embodiments. In some embodiments, the distance D1 is in a range from about 5 nm to about 35 nm. In some embodiments, the source/drain recesses 122 have curved bottom surfaces, as shown in FIGS. 3B-1 and 3B-2, in accordance with some embodiments.

FIGS. 3C-1 to 3C-5 are cross-sectional views of a semiconductor structure 100 after the formation of notches 124, in accordance with some embodiments.

An etching process is performed to laterally recess the first semiconductor layers 106 of the active regions 104 from the source/drain recesses 122 toward the channel regions, thereby forming notches 124, as shown in FIGS. 3C-1, 3C-2 and 3C-5, in accordance with some embodiments. In some embodiments, the etching process is an isotropic etching such as dry chemical etching, remote plasma etching, wet chemical etching, another suitable technique, or a combination thereof. The notches 124 are formed between adjacent second semiconductor layers 108 and between the lowermost second semiconductor layer 108 and the lower fin element 103P (or 103N), in accordance with some embodiments.

In some embodiments, the notches 124 are located directly below the gate spacer layers 120. In some embodiments, the recessing depth D2 (the dimension in the X direction) of the notches 124 is in a range from about 2.5 nm to about 10 nm. In some embodiments, the recessing depth D2 of the notches 124 is less than the thickness T3 of the gate spacer layers 120 by a distance D3. In some embodiments, the distance D3 is in a range from about 0.5 nm to about 3 nm. In some embodiments, the etched first semiconductor layers 106 have a length L2 (e.g., the dimension in the X direction). In some embodiments, the length L2 is in a range from about 6 nm to about 27 nm. In some embodiments, the length L2 of the etched first semiconductor layers 106 is longer than the length L1 of the dummy gate electrode layer 112. In some embodiments, the ratio (L2/L1) of the length L2 to the length L1 is in a range from about 1.05 to about 1.3.

Figures 3, 3C, 4:
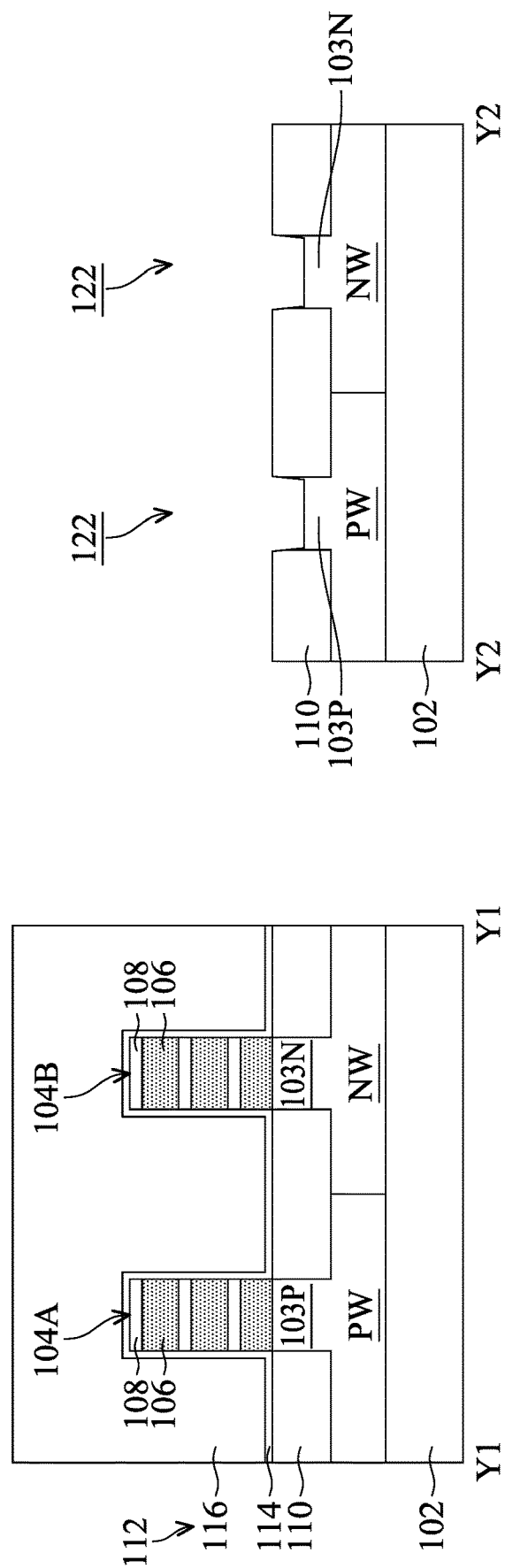
Figures 3, 3C, 4, 5:
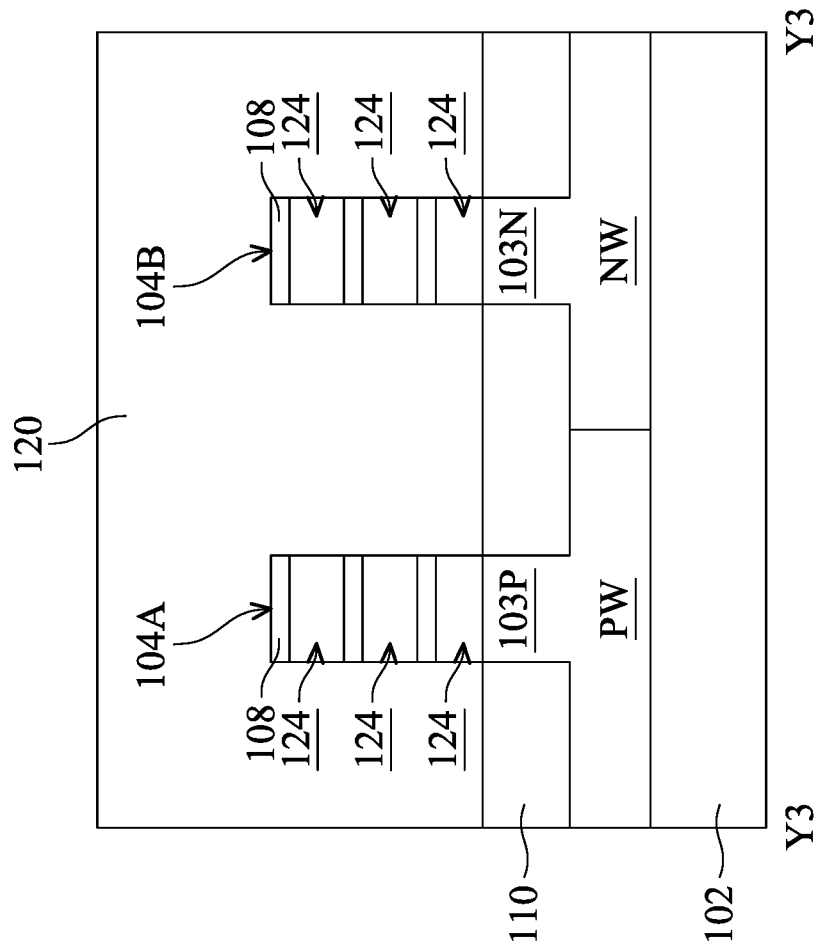

In some embodiments, the etched first semiconductor layers 106 have substantially flat sidewalls 106S (which are exposed from the notches 124). The substantially flat sidewall 106S of the first semiconductor layers 106 has a vertical extension line that is between the vertical extension lines of the sidewalls 120S1 and 120S2 of the gate spacer layers 120, as shown in FIGS. 3C-1 and 3C-2, in accordance with some embodiments. In some embodiments, the vertical extension line of the sidewall 106S is closer to the vertical extension line of the sidewall 120S1 than to the vertical extension line of the sidewall 120S2.

FIGS. 3D-1 to 3D-5 are cross-sectional views of a semiconductor structure 100 after the formation of inner spacer layers 126, in accordance with some embodiments.

Inner spacer layers 126 are formed in the notches 124, as shown in FIGS. 3D-1, 3D-2 and 3D-5, in accordance with some embodiments. The inner spacer layers 126 are formed to abut the sidewalls 106S (FIGS. 3C-1 and 3C-2) of the first semiconductor layers 106, in accordance with some embodiments. In some embodiments, the inner spacer layers 126 are located between adjacent second semiconductor layers 108 and between the lowermost second semiconductor layer 108 and the lower fin element 103P (or 103N). In some embodiments, the inner spacer layers 126 extend directly below the gate spacer layers 120, in accordance with some embodiments.

The inner spacer layers 126 may avoid the source/drain features and the gate stack from being in direct contact and are configured to reduce the parasitic capacitance between the gate stack and the source/drain features (i.e., Cgs and Cgd), in accordance with some embodiments. In some embodiments, the inner spacer layers 126 are made of dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). In some embodiments, the inner spacer layers 126 are made of low-k dielectric materials. For example, the dielectric constant (k) value of the inner spacer layers 126 may be lower than a k-value of silicon oxide (SiO), such as lower than 4.2, equal to or lower than about 3.9, such as in a range from about 3.5 to about 3.9. In alternative embodiments, the inner spacer layers 126 may further include an air gap within the dielectric material.

In some embodiments, the dielectric constant value of the inner spacer layers 126 is less than that of the gate spacer layers 120. In some embodiments, the inner spacer layers 126 having relatively low dielectric constant value may further decrease the capacitance between subsequently formed gate stacks and the source/drain features, and the gate spacer layers 120 having relatively high dielectric constant value may improve the breakdown voltage between subsequently formed contact plugs and final gate stacks. In some embodiments, the dielectric constant value of the inner spacer layers 126 is greater than that of the gate spacer layers 120. In some embodiments, the inner spacer layers 126 having relatively high dielectric constant value may increase the etching resistance in a subsequent etching process for removing the first semiconductor layers 106, and the gate spacer layers 120 having relatively low dielectric constant value may further reduce the capacitance between subsequently formed gate stacks and the contact plugs. The dielectric constant values of the inner spacer layers 126 and the gate spacer layers 120 may be adjusted based on the performance demand of the resulting semiconductor device.

In some embodiments, the inner spacer layers 126 are formed by depositing a dielectric material for the inner spacer layers 126 over the semiconductor structure 100 to fill the notches 124, and then etching back the dielectric material to remove the dielectric material outside the notches 124. Portions of the dielectric material left in the notches serve as the inner spacer layers 126, in accordance with some embodiments. In some embodiments, the deposition process includes ALD, CVD (such as PECVD, LPCVD or HARP), another suitable technique, or a combination thereof. In some embodiments, the etching back process includes an anisotropic etching process such as dry plasma etching, an isotropic etching process such as dry chemical etching, remote plasma etching or wet chemical etching, or a combination thereof.

In some embodiments, the inner spacer layers 126 have thickness T4 in the X direction. In some embodiments, the thickness T4 is in a range from about 2.5 nm to about 10 nm. In some embodiments, the thickness T4 of the notches 124 is less than the thickness T3 of the gate spacer layers 120 by a distance D3. In some embodiments, the distance D3 is in a range from about to about 0.5 nm to about 3 nm. In some embodiments, the ratio of the thickness T3 to the thickness T4 is in a range from about 1.05 to about 1.4.

Figures 3, 3D, 4:
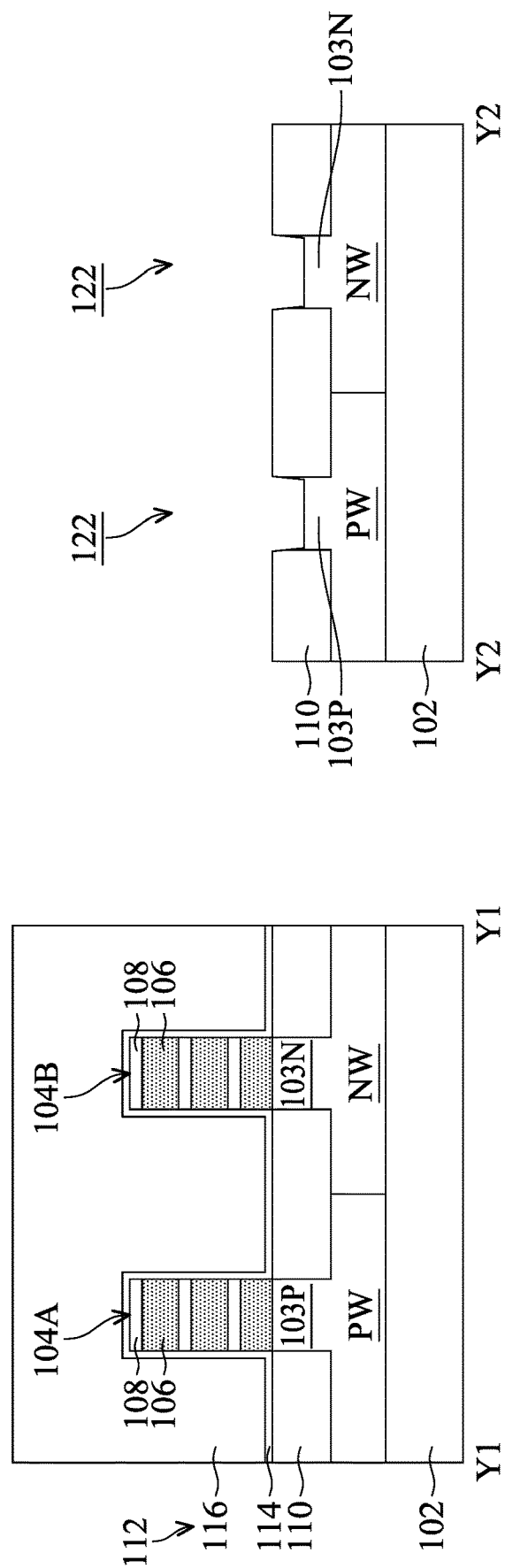
Figures 3, 3D, 4, 5:
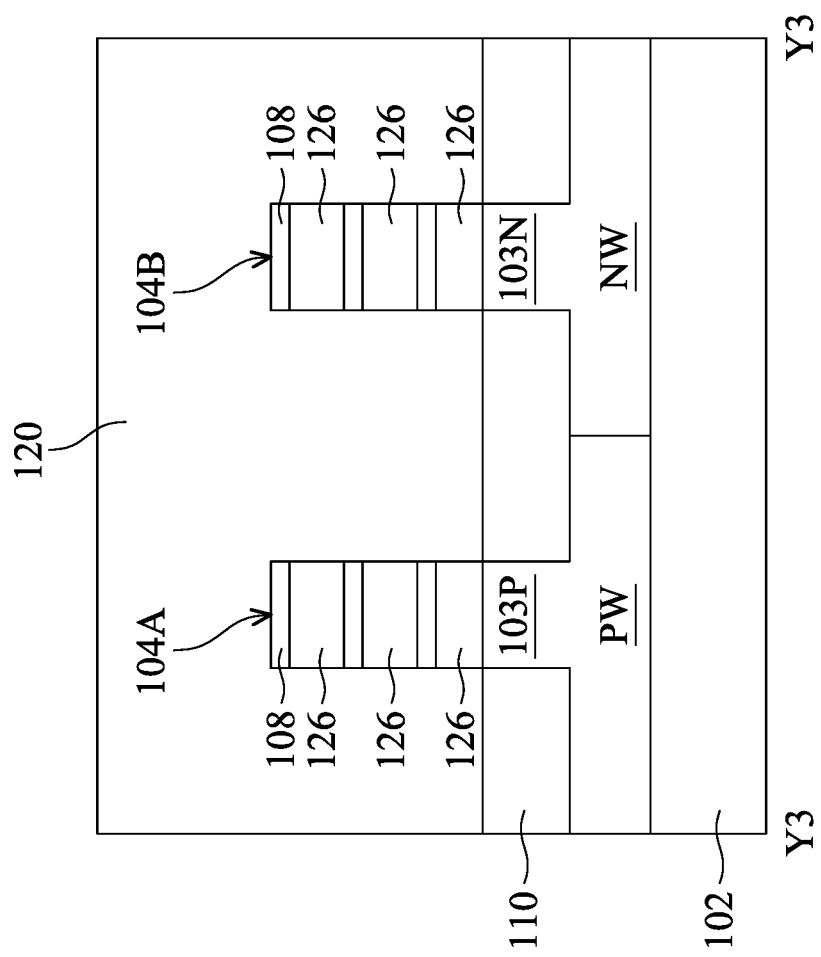
Figures 1, 2, 3E:
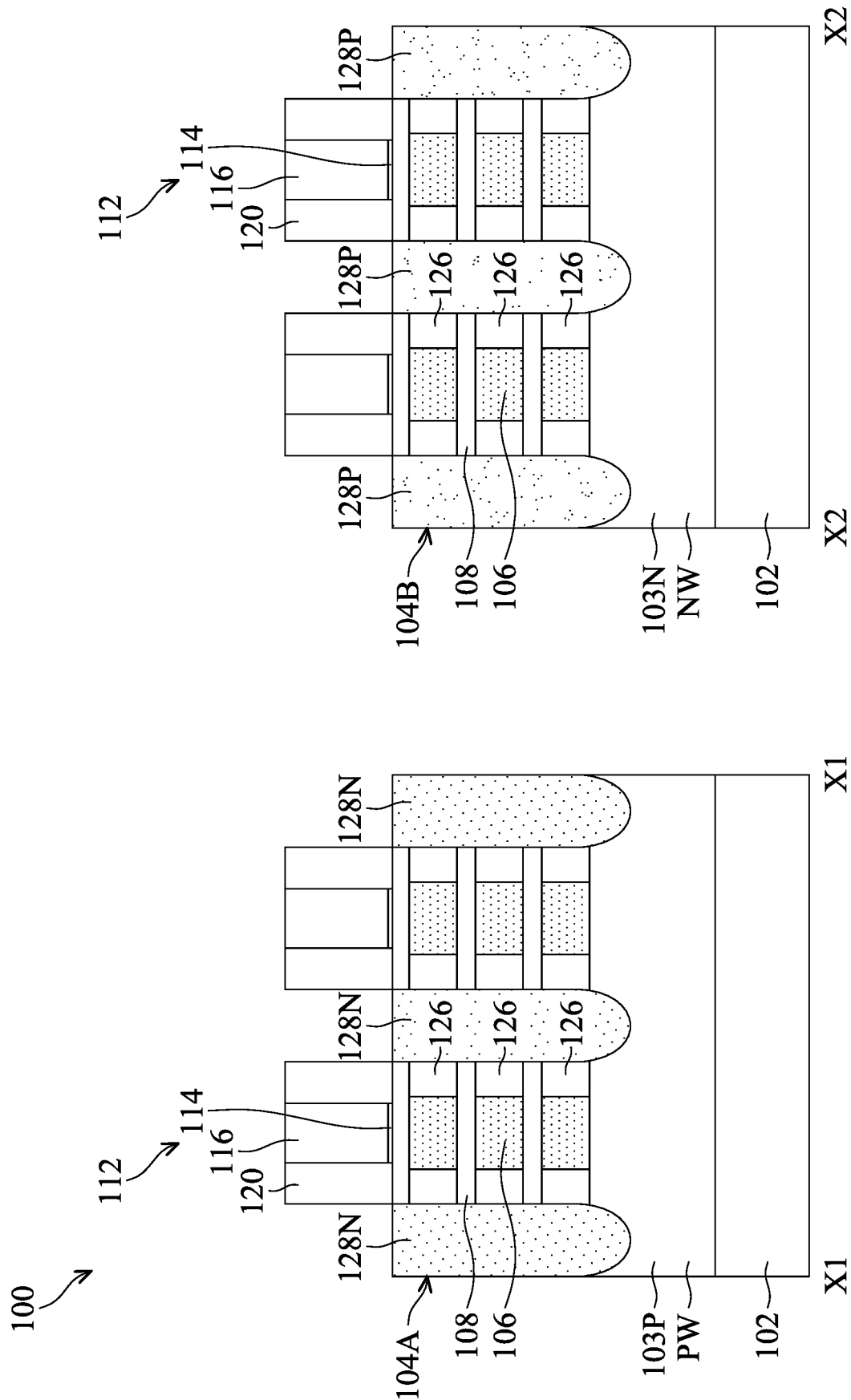
Figures 3, 3F, 4:
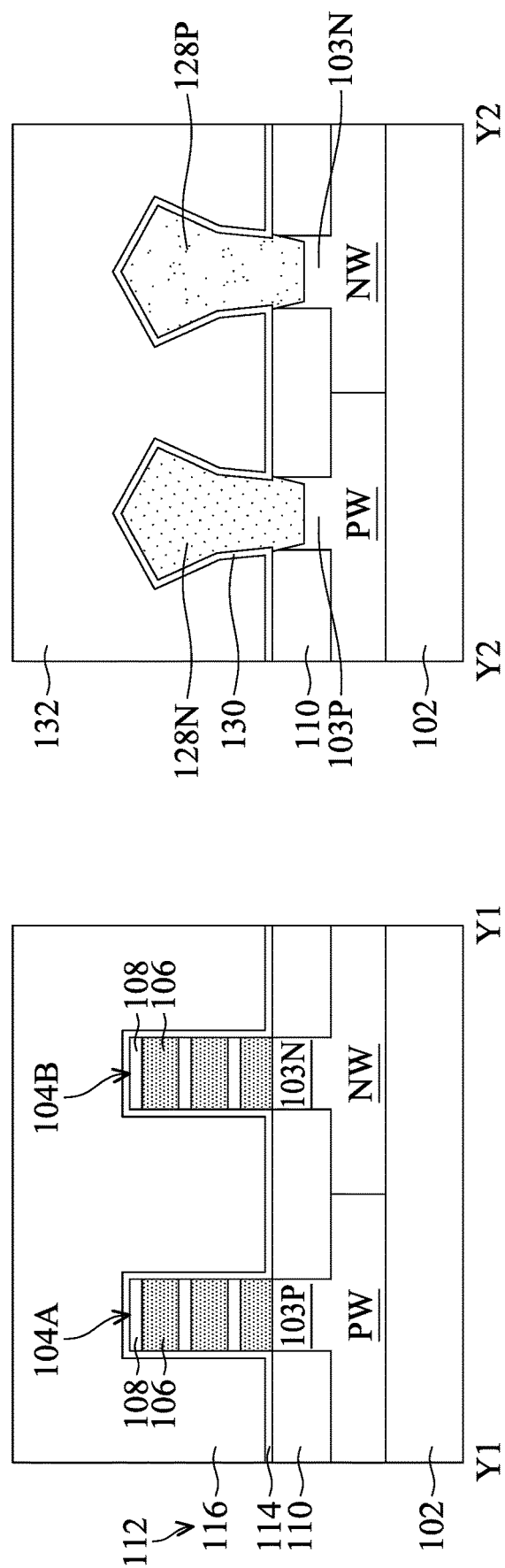

In some embodiments, the inner spacer layers 126 have substantially flat sidewalls 126S interfaced with the sidewalls 106S (FIGS. 3C-1 and 3C-2). The substantially flat sidewall 126S of the inner spacer layers 126 has a vertical extension line that is between the vertical extension lines of sidewalls 120S1 and 120S2 of the gate spacer layers 120, as shown in FIG. 3D-1, in accordance with some embodiments. In some embodiments, the vertical extension line of the sidewall 126S is closer to the vertical extension line of the sidewall 120S1 than to the vertical extension line of the sidewall 120S2.

FIGS. 3E-1 to 3E-4 are cross-sectional views of a semiconductor structure 100 after the formation of source/drain features 128 (including 128N and 128P), in accordance with some embodiments.

Source/drain features 128N and 128P are formed in the source/drain recesses 122 over the lower fin element 103P of the active region 104A and lower fin element 103N of the active region 104B, respectively, as shown in FIGS. 3E-1, 3E-2 and 3E-4, in accordance with some embodiments. The source/drain features 128 are formed on opposite sides of the dummy gate structures 112, in accordance with some embodiments. In some embodiments, the source/drain features 128N have a different electrically conductive type than the source/drain features 128P. The formation may include one or more epitaxial growth processes. These epitaxial growth processes may be MBE, MOCVD, or VPE, another suitable technique, or a combination thereof.

In some embodiments, the source/drain features 128N and the source/drain features 128P may be formed separately. For example, a patterned mask layer (such as photoresist layer and/or hard mask layer) may be formed to cover the semiconductor structure 100 over the n-type well NW, and then the source/drain features 128N are grown. Afterward, the patterned mask layer may be removed. Similarly, a patterned mask layer (such as photoresist layer and/or hard mask layer) is formed to cover the semiconductor structure 100 over the p-type well PW, and then the source/drain features 128P are grown. Afterward, the patterned mask layer may be removed.

In some embodiments, the source/drain features 128N and 128P are in-situ doped during the epitaxial processes. In some embodiments, the source/drain features 128N are doped with the n-type dopant during the epitaxial growth process. For example, the n-type dopant may be phosphorous (P) or arsenic (As). For example, the n-type source/drain features 128N may be the epitaxially grown silicon phosphorous (SiP), silicon carbon (SiC), silicon phosphorous carbon (SiPC), silicon phosphorous arsenic (SiPAs), silicon arsenic (SiAs), silicon (Si) or a combination thereof doped with phosphorous and/or arsenic. In some embodiments, the concentrations of the dopant (e.g., P) in the source/drain features 128N are in a range from about $2\times10^{19}$ cm$^{-3}$ to about $3\times10^{21}$ cm$^{-3}$.

In some embodiments, the source/drain features 128P are doped with the p-type dopant during the epitaxial growth process. For example, the p-type dopant may be boron (B) or BF$_2$. For example, the p-type source/drain features 128P may be the epitaxially grown silicon germanium (SiGe), silicon germanium carbon (SiGeC), germanium (Ge), silicon (P) or a combination thereof doped with boron (B). In some embodiments, the concentrations of the dopant (e.g., B) in the source/drain features 128P are in a range from about $1\times10^{19}$ cm$^{-3}$ to about $6\times10^{20}$ cm$^{-3}$. In some embodiments, the n-type source/drain features 128P and the p-type source/drain features 128P are made of different epitaxial materials. For example, the n-type source/drain features 128N are made of SiP, and the p-type source/drain features 128P are made of SiGe.

FIGS. 3F-1 to 3F-4 are cross-sectional views of a semiconductor structure 100 after the formation of contact etching stop layer (CESL) 130 and a first interlayer dielectric layer 132, in accordance with some embodiments.

A contact etching stop layer 130 is formed over the semiconductor structure 100 to cover the source/drain features 128N and 128P, as shown in FIGS. 3F-1, 3F-2 and 3F-4, in accordance with some embodiments. The contact etching stop layer 130 is further formed along, and covers, the sidewalls 120S2 of the gate spacer layer 120 and the upper surface of the isolation structure 110, in accordance with some embodiments. In some embodiments, the contact etching stop layer 130 is made of dielectric material, such as silicon nitride (SiN), silicon oxide (SiO$_2$), silicon oxynitride (SiOC), silicon carbide (SiC), oxygen-doped silicon carbide (SiC:O), oxygen-doped silicon carbonitride (Si(O)CN), or a combination thereof. In some embodiments, a dielectric material for the contact etching stop layer 130 is globally and conformally deposited over the semiconductor structure 100 using CVD (such as LPCVD, PECVD, HDP-CVD, or HARP), ALD, another suitable method, or a combination thereof.

Afterward, a first interlayer dielectric layer 132 is formed over the contact etching stop layer 130, as shown in FIGS. 3F-1, 3F-2 and 3F-4, in accordance with some embodiments. The first interlayer dielectric layer 132 overfills the space between dummy gate structures 112, in accordance with some embodiments. In some embodiments, the first interlayer dielectric layer 132 is made of dielectric material, such as un-doped silicate glass (USG), doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the first interlayer dielectric layer 132 and the contact etching stop layer 130 are made of different materials and have a great difference in etching selectivity. In some embodiments, the dielectric material for the first interlayer dielectric layer 132 is deposited using such as CVD (such as HDP-CVD, PECVD, HARP or FCVD), another suitable technique, or a combination thereof. The dielectric materials for the contact etching stop layer 130 and the first interlayer dielectric layer 132 above the upper surface of the dummy gate electrode layer 116 are removed using such as CMP, in accordance with some embodiments.

FIGS. 3G-1 to 3G-6 are cross-sectional views of a semiconductor structure 100 after the formation of gate trenches 134 and gaps 136, in accordance with some embodiments. FIG. 3G-6 is a cross-sectional view of the semiconductor structure 100 taken along line Y4-Y4 shown in FIG. 3G-1.

The dummy gate structures 112 are removed using etching process to form gate trenches 134 between the gate spacer layers 120, as shown in FIGS. 3G-1, 3G-2 and 3G-3, in accordance with some embodiments. In some embodiments, the gate trenches 134 expose the channel regions of the active regions 104A and 104B. In some embodiments, the gate trenches 134 further expose the sidewalls 120S1 of the gate spacer layers 120 facing the channel region. In some embodiments, the etching process includes one or more etching processes. For example, when the dummy gate electrode layer 116 is made of polysilicon, a wet etchant such as a tetramethylammonium hydroxide (TMAH) solution may be used to selectively remove the dummy gate electrode layer 116. For example, the dummy gate dielectric layer 114 may be thereafter removed using a plasma dry etching, a dry chemical etching, and/or a wet etching.

Afterward, an etching process is performed to remove the first semiconductor layers 106 of the active regions 104A and 104B to form gaps 136, as shown in FIGS. 3G-1, 2G-2 and 2G-3, in accordance with some embodiments. The inner spacer layers 126 may be used as an etching stop layer in the etching process, which may protect the source/drain features 128N and 128P from being damaged. In some embodiments, the etching process includes a selective wet etching process, such as APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions.

The gaps 136 are formed between adjacent second semiconductor layers 108 and between the lowermost second semiconductor layer 108 and the lower fin element 103P (or 103N), in accordance with some embodiments. In some embodiments, the gaps 136 also expose the sidewalls 126S of the inner spacer layers 126 facing the channel region.

Figures 2, 3G:
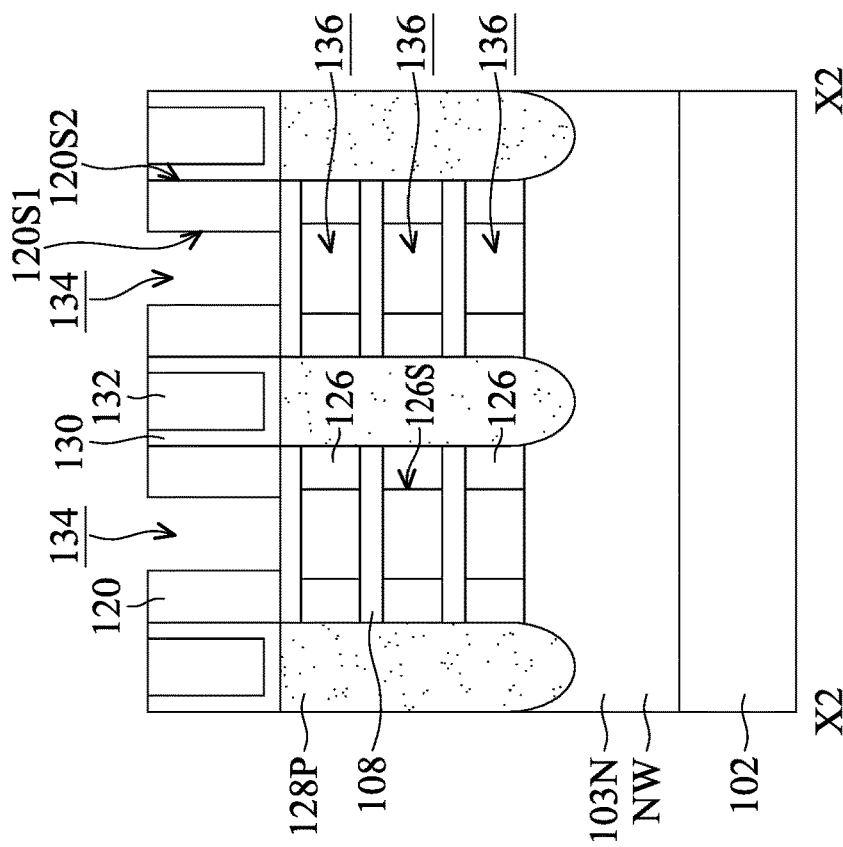
Figures 1, 3G:
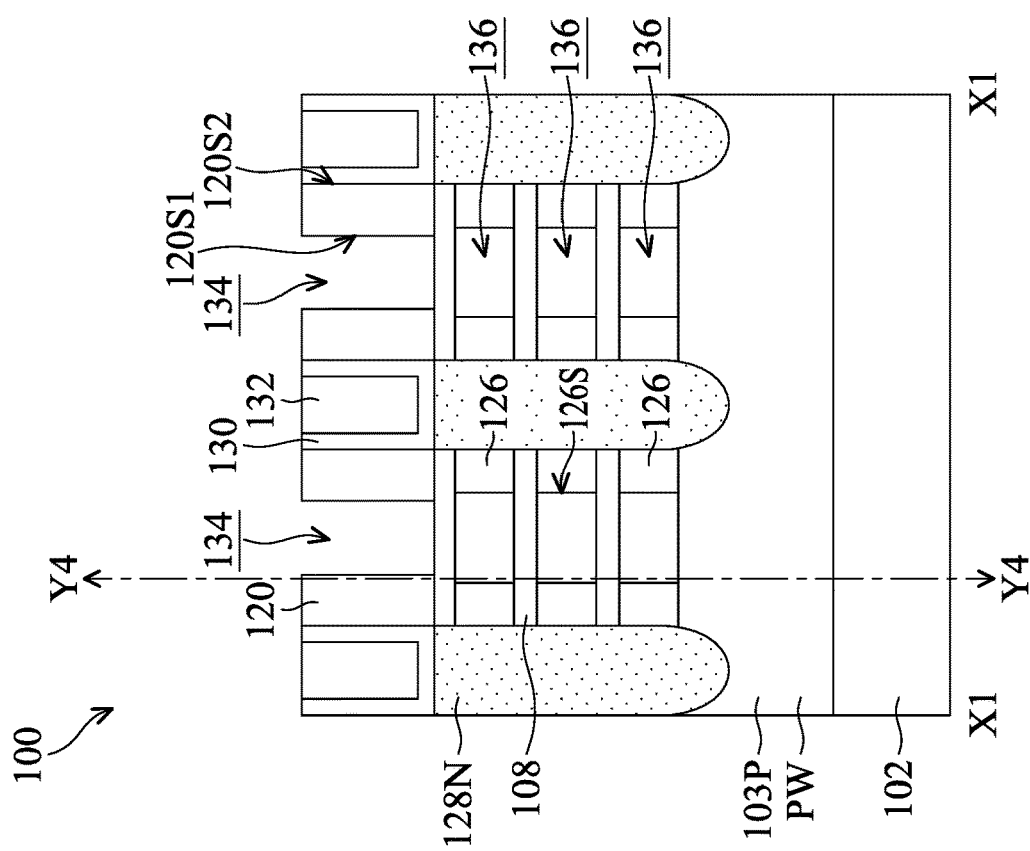
Figures 3, 3G, 4:
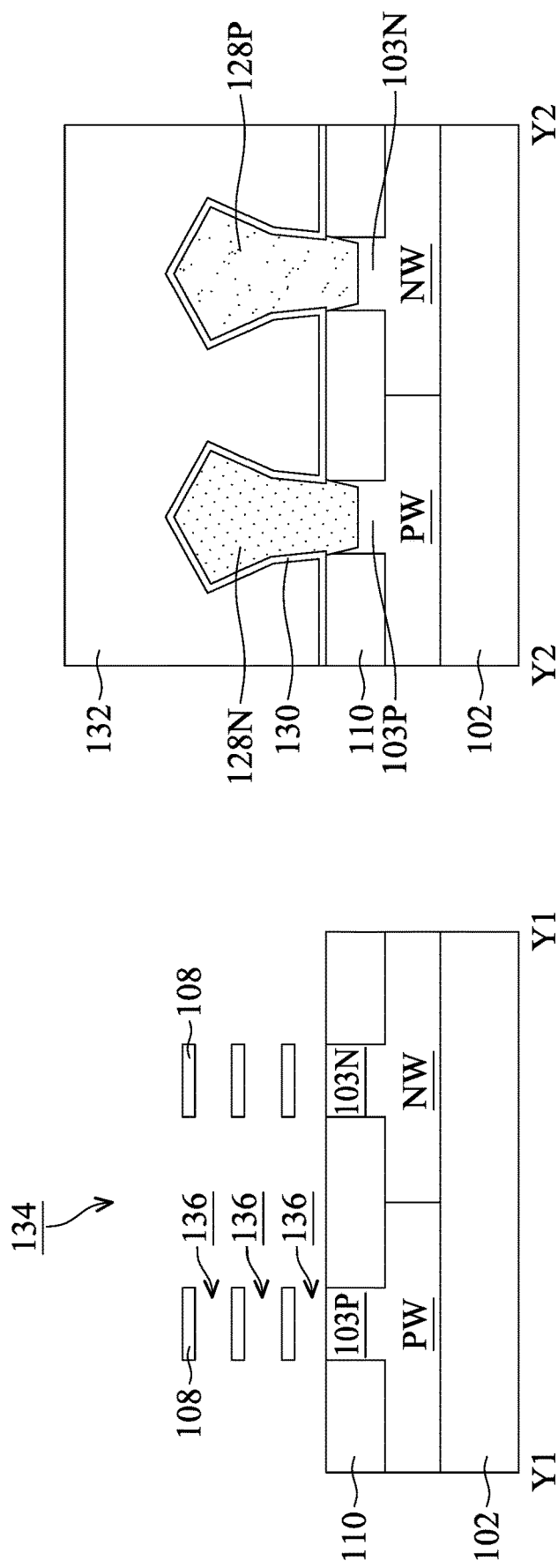
Figures 3, 3G, 4, 5, 6:
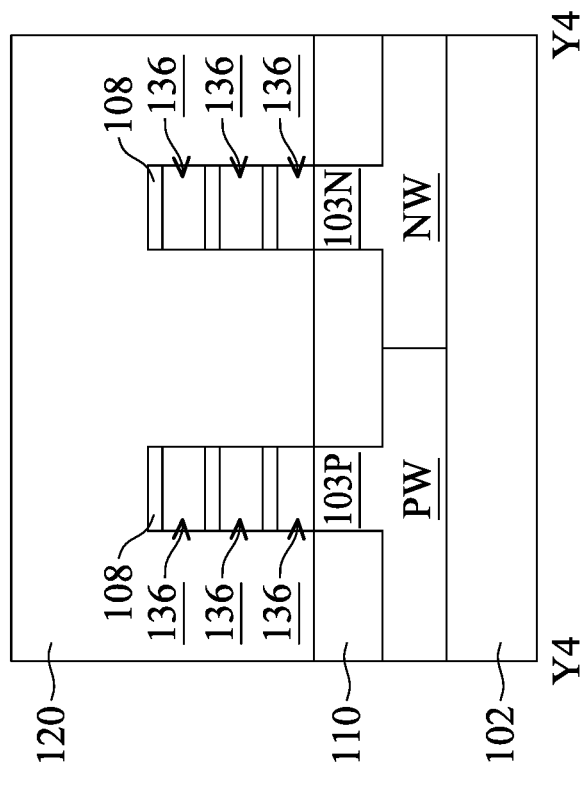
Figures 3, 3G, 4, 5:
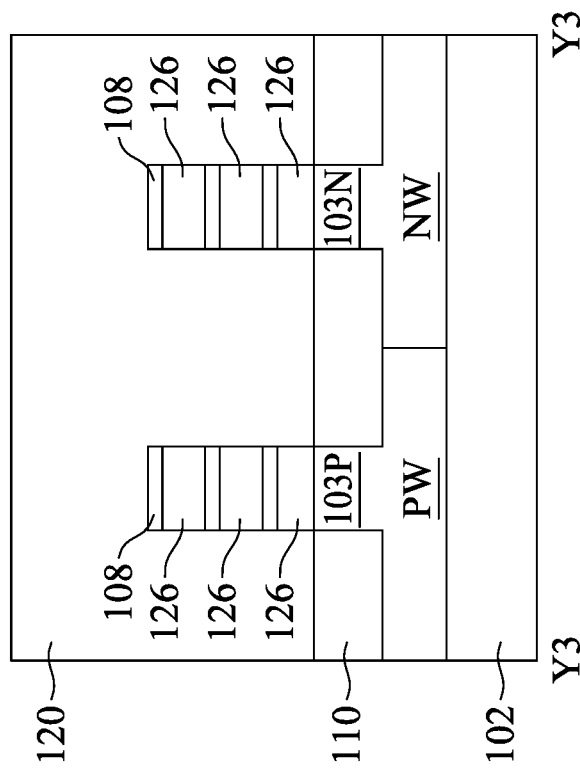

After the one or more etching processes, the four main surfaces of the second semiconductor layers 108 are exposed, in accordance with some embodiments. The exposed second semiconductor layers 108 of each of the active regions 104 form two sets of nanostructures 108, as shown in FIGS. 3G-1 and 3G-2, in accordance with some embodiments. Each set includes three nanostructures 108 vertically stacked and spaced apart from one other, in accordance with some embodiments. As the term is used herein, "nanostructures" refers to the semiconductor layers with cylindrical shape, bar shaped and/or sheet shape. The nanostructures 108 function as channels of the resulting semiconductor devices (e.g., nanostructure transistors such as GAA transistors), in accordance with some embodiments. In some embodiments, the portions of the nanostructures 108 sandwiched between the gate spacer layer 122 and the inner spacer layer 126 and between the second semiconductor layers 108 are referred to as LDD (light dopant drain) regions.

In some embodiments, the dimension of the gate trench 134 in the X direction is shorter than the dimension of the gaps 136 in the X direction. In some embodiments, in FIG. 3G-6, the topmost nanostructure 108 has a bottom surface that is exposed from the gap 136 and a top surface that interfaces with the gate spacer layer 120, and the top and bottom surfaces of other nanostructures 108 are exposed from the gap 136.

FIGS. 3H-1 to 3H-6 are cross-sectional views of a semiconductor structure 100 after the formation of final gate stacks 138, in accordance with some embodiments. FIG. 3H-6 is a cross-sectional view of the semiconductor structure 100 taken along line Y4-Y4 shown in FIG. 3H-1.

Final gate stacks 138 are formed in the gate trenches 134 and gaps 136, thereby wrapping around the nanostructures 108, as shown in FIGS. 3H-1, 3H-2 and 3H-3, in accordance with some embodiments. In some embodiments, the final gate stacks 138 extend in the Y direction. That is, the final gate stacks 138 have longitudinal axes parallel to the Y direction, in accordance with some embodiments. The final gate stacks 138 engage the channel region so that current can flow between the source/drain regions during operation. In some embodiments, each of the final gate stacks 138 includes an interfacial layer 140, a gate dielectric layer 142 and a work function metal material 144 (including 144N and 144P), as shown in FIGS. 3H-1, 3H-2 and 3H-3, in accordance with some embodiments.

The interfacial layer 140 is formed on the exposed surfaces of the nanostructures 108 and the exposed upper surfaces of the lower fin elements 103P and 103N, in accordance with some embodiments. The interfacial layer 140 wraps around the nanostructures 108, in accordance with some embodiments. In some embodiments, the interfacial layer 140 is made of a chemically formed silicon oxide. In some embodiments, the interfacial layer 140 is nitrogen-doped silicon oxide. In some embodiments, the interfacial layer 140 is formed using one or more cleaning processes such as including ozone ($O_3$), ammonia hydroxide-hydrogen peroxide-water mixture, and/or hydrochloric acid-hydrogen peroxide-water mixture. Semiconductor material from the nanostructures 108 and the lower fin elements 103P and 103N is oxidized to form the interfacial layer 140, in accordance with some embodiments.

Figures 3, 3H, 4:
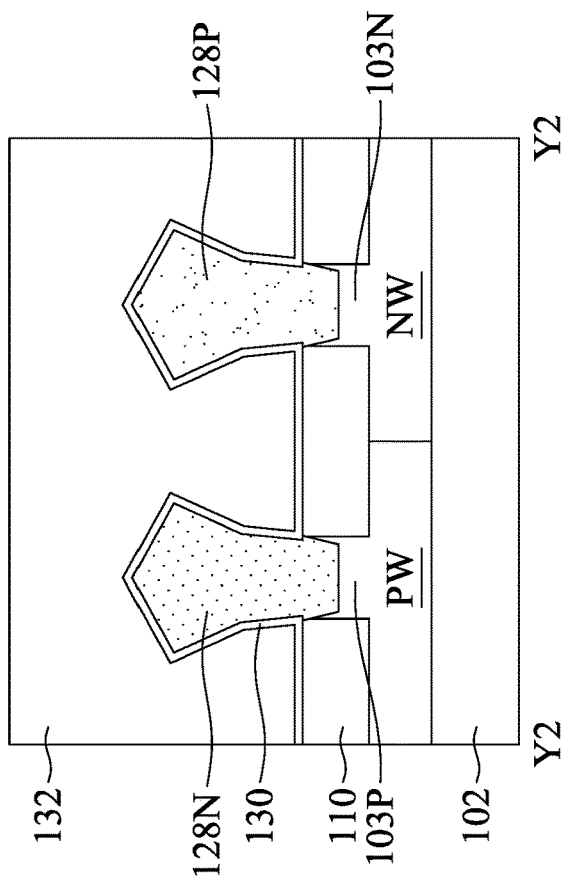
Figures 3, 3H:
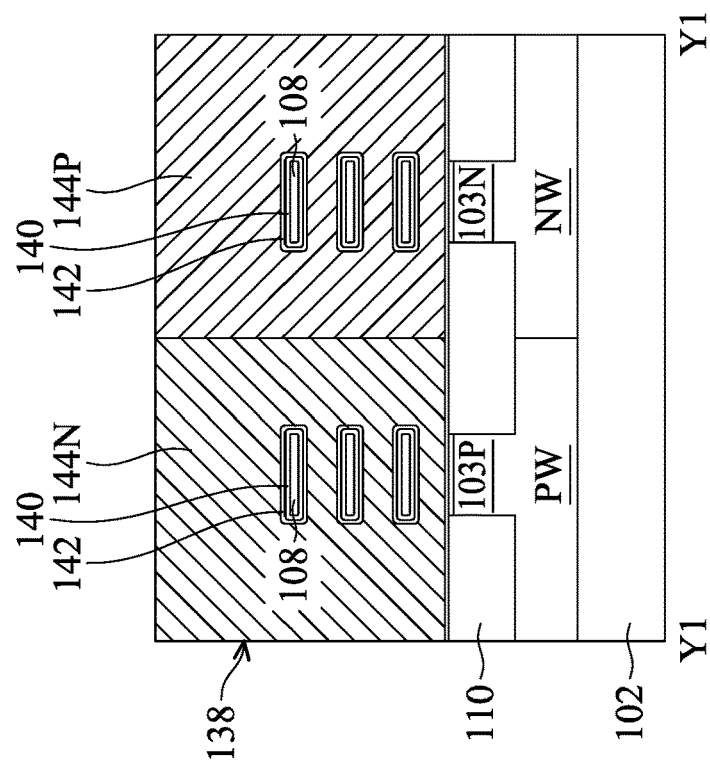
Figures 3, 3H, 4, 5, 6:
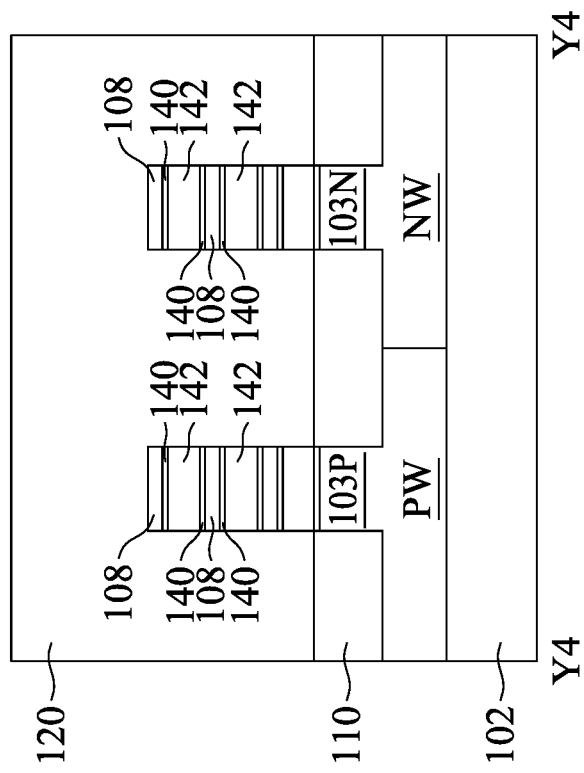
Figures 3, 3H, 4, 5:
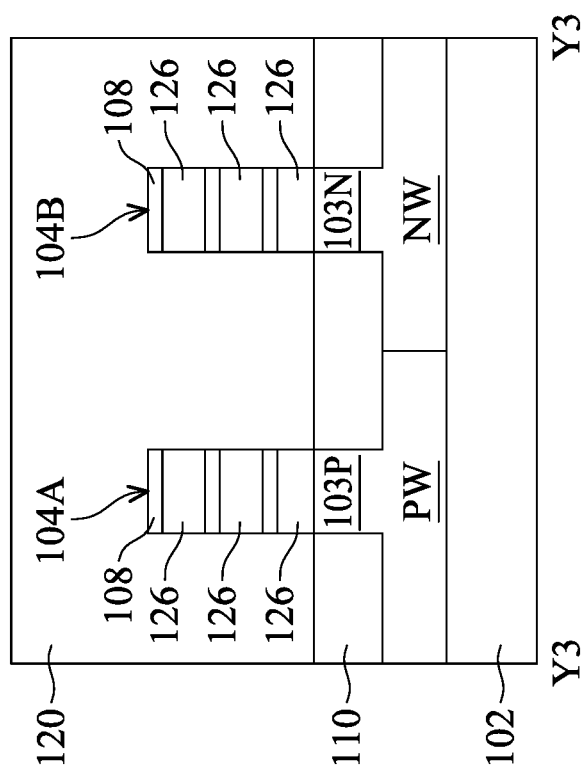

In some embodiments, a portion of the interfacial layer includes on the top surface of the topmost nanostructure 108 is shorter than a portion of the interfacial layer on the bottom surface of the topmost nanostructure 108, as shown in FIGS. 3H-1 and 3H-2.

The gate dielectric layer 142 is formed conformally along the interfacial layer 140 to wrap around the nanostructures 108, in accordance with some embodiments. The gate dielectric layer 142 is further formed along the upper surface of the isolation structure 110, in accordance with some embodiments. The gate dielectric layer 142 is also conformally formed along the sidewalls 120S1 of the gate spacer layers 120 facing the channel region, in accordance with some embodiments. The gate dielectric layer 142 is also conformally formed along the sidewalls 126S of the inner spacer layers 126 facing the channel region, in accordance with some embodiments. In some embodiments, in FIG. 3H-6, the topmost nanostructure 108 has a bottom surface covered by the interfacial layer 140 and a top surface covered by the gate spacer layer 120, and the top and bottom surfaces of other nanostructures 108 are covered by the interfacial layer 140.

The gate dielectric layer 142 may be high-k dielectric layer. In some embodiments, the high-k dielectric layer is dielectric material with high dielectric constant (k value), for example, greater than 9, such as greater than 13. In some embodiments, the high-k dielectric layer includes hafnium oxide ($HfO_2$), $TiO_2$, HfZrO, $Ta_2O_3$, $HfSiO_4$, $ZrO_2$, $ZrSiO_2$, LaO, $Al_2O_3$, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Si_3N_4$, oxynitrides (SiON), a combination thereof, or another suitable material. The high-k dielectric layer may be deposited using ALD, PVD, CVD, and/or another suitable technique. In some embodiments, the gate dielectric layer 142 has a thickness in a range from about 0.5 nm to about 3 nm.

The work function metal material 144 (including 144N and 144P) is formed to fill remainders of the gate trenches 134 and gaps 136, in accordance with some embodiments. The work function metal material 144N is formed over the p-type well PW, and the work function metal material 144P is formed over the n-type well NW, in accordance with some embodiments. In some embodiments, the work function metal materials 144N and 144P may be used for metal gate electrode layers of the final gate stacks 138. In some embodiments, the work function metal materials 144N and 144P have selected work functions to enhance the device performance (e.g., threshold voltage) for n-channel FETs or p-channel FETs.

In some embodiments, the work function metal materials 144N and 144P are made of more than one conductive material, such as a metal, metal alloy, conductive metal oxide and/or metal nitride, another suitable conductive material, or a combination thereof. For example, the work function metal material 144 is TiN, TaN, TiAl, TiAlN, TaAl, TaAlN, TaAlC, TaCN, WNC, Co, Pt, W, Ti, Ag, Al, TaC, TaSiN, Mn, Zr, Ru, Mo, WN, Cu, W, Re, Ir, Ni, another suitable conductive material, or multilayers thereof. The work function metal materials 144N includes a different combination of materials than the work function metal materials 144P, in accordance with some embodiments. The work function metal material 144 may be formed using ALD, PVD, CVD, e-beam evaporation, or another suitable technique.

The work function metal materials 144N and 144P may be formed separately for n-channel nanostructure transistors and p-channel nanostructure transistors, which may use different work function materials. For example, a patterned mask layer (such as a photoresist layer and/or a hard mask layer) is formed to cover regions of the substrate 102 over the p-type well PW, and the conductive materials for the work function metal material 144P are deposited, in accordance with some embodiments. Afterward, the patterned mask layer may be removed. Similarly, a patterned mask layer (such as photoresist layer and/or hard mask layer) is formed to cover regions of the substrate 102 over the n-type well NW, and the conductive materials for the work function metal material 144N are deposited, in accordance with some embodiments. Afterward, the patterned mask layer may be removed. In alternative embodiments, the conductive material for the work function metal materials 144N is the same as the conductive material for the work function metal materials 144P.

A planarization process such as CMP may be performed on the semiconductor structure 100 to remove the materials of the gate dielectric layer 142 and the work function metal material 144 formed above the upper surface of the first interlayer dielectric layer 132, in accordance with some embodiments. The final gate stacks 138 wrapping around the nanostructures 108 of the active regions 104 combine with the neighboring source/drain features 128 to form nanostructure transistors. In some embodiments, the neighboring transistors share a common source/drain feature 128.

The portions of the work function metal materials 144N and 144P which are formed between the gate spacer layers 120 are referred to as top gate electrode layers TG, as shown in FIGS. 3H-1 and 3H-2, in accordance with some embodiments. The top gate electrode layers TG are located above the topmost nanostructures 108, in accordance with some embodiments. The portions of the work function metal materials 144N and 144P which are formed between the inner spacer layers 126 are referred to as inner gate electrode layers IG, as shown in FIGS. 3H-1 and 3H-2, in accordance with some embodiments. The inner gate electrode layers IG are located between the nanostructures 108 and between the bottommost nanostructures 108 and the lower fin element 103P (or 103N), in accordance with some embodiments.

In some embodiments, the top gate electrode layers TG have a length L3 (e.g., the dimension in the X direction). In some embodiments, the length L3 is in a range from 5 nm to about 20 nm. In some embodiments, the inner gate electrode layers IG have a length L4 (e.g., the dimension in the X direction). In some embodiments, the length L4 is in a range from about 5.5 nm to about 24 nm. In some embodiments, the length L4 of the inner gate electrode layers IG is longer than the length L3 of the top gate electrode layers TG by a distance D4. In some embodiments, the distance D4 is in a range from about to about 0.5 nm to about 4 nm. In some embodiments, the ratio (L4/L3) of the length L4 to the length L3 is in a range from about 1.05 to about 1.3.

In some embodiments, the length L3 of the top gate electrode layers TG may be the minimum critical dimension (CD) of the semiconductor components in the semiconductor manufacturing process. In some embodiments, the top gate electrode layers TG, defined by the dummy gate structures 112, keep the minimum gate length (Lg), which may improve the density of components of the resulting semiconductor device. Furthermore, in some embodiments, the inner gate electrode layers IG have longer length L4 than the length L3 of the top gate electrode layers TG, and thus may have better control over the channel regions of the nanostructures 108, which may enhance the performance of the resulting semiconductor device, e.g., lower gate leakage, lower off-state current (Isoff)), etc. If the ratio (L4/L3) or the length L4 is too low, the control of gate over the channel regions may be not sufficiently improved. If the ratio (L4/L3) or the length L4 is too high, the parasitic capacitance of the resulting semiconductor device may be increased.

In addition, in some embodiments, the gate spacer layers 120 have greater thickness T3 than the thickness T4 of the inner spacer layers 126, and thus may increase the distance between the metal gate electrode layers and subsequently formed contact plugs. As a result, the capacitance between the contact plugs and the metal gate electrode layers may be reduced and/or the breakdown voltage between the contact plugs and the metal gate electrode layers may be improved. Therefore, the performance of the resulting semiconductor device may be enhanced, e.g., higher speed, better reliability, etc. Furthermore, the inner gate spacer layers 126 have less thickness T4 than the thickness T3 of the gate spacer layers 120, and thus may reduce the dimension of the LDD regions of the nanostructures 108. Therefore, the performance of the resulting semiconductor device may be enhanced, e.g., greater on-state current (Ion), lower sheet resistance (Rs), etc.

FIGS. 3I-1 to 3I-5 are cross-sectional views of a semiconductor structure 100 after the formation of dielectric cap layers 146, gate isolation layer 148, silicide layers 150, contact plugs 152, a second interlayer dielectric layer 154, vias 156 and 158, in accordance with some embodiments.

An etching process is performed to recess the final gate stacks 138 and the gate spacer layers 120 thereby forming recesses, and then dielectric cap layers 146 are formed in the recesses, as shown in FIGS. 3I-1, 3I-2, 3I-3 and 3I-5, in accordance with some embodiments. The etching process may be an anisotropic etching process such as dry plasma etching, an isotropic etching process such as dry chemical etching, remote plasma etching or wet chemical etching, and/or a combination thereof. In some embodiments, the dielectric cap layers 146 are made of dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide (SiO$_2$), nitride-based dielectric, metal oxide dielectric such as HfO$_2$, Ta$_2$O$_5$, TiO$_2$, ZrO$_2$, Al$_2$O$_3$, Y$_2$O$_3$, or a combination thereof.

In some embodiments, a dielectric material for the dielectric cap layers 146 is deposited using such as ALD, CVD (such as LPCVD, PECVD, HDP-CVD, or HARP), another suitable technique, and/or a combination thereof. Afterward, a planarization process is performed on the dielectric material for the dielectric cap layers 146 until the first interlayer dielectric layer 132 is exposed, in accordance with some embodiments. The planarization may be CMP, etching back process, or a combination thereof. In some embodiments, the thickness of the dielectric cap layers 146 is in a range from about 2 nm to about 60 nm.

Gate isolation structures 148 are formed in and/or through the dielectric capping layers 146, the final gate stacks 138 and the gate spacer layers 120 and land on the isolation structure 110, as shown in FIGS. 3I-3 and 3I-5, in accordance with some embodiments. The final gate stacks 138 are cut through by the gate isolation structures 148 into several segments, in accordance with some embodiments. The formation of the gate isolation structures 148 includes patterning the dielectric capping layers 146, the final gate stacks 138 and the gate spacer layers 120 to form gate-cut openings (where the gate isolation structures 148 are to be formed) using photolithography and etching processes until the isolation structure 110 is exposed. The etch processes may include dry etching such as reactive ion etch (RIE), neutral beam etch (NBE), inductive coupled plasma (ICP) etch, capacitively coupled plasma (CCP) etch, another suitable method, or a combination thereof.

The formation of the gate isolation structures 148 further includes depositing a dielectric material for the gate isolation structures 148 to overfill the gate-cut opening, in accordance with some embodiments. The gate isolation structures 148 are made of dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide (SiO$_2$), or a combination thereof. In some embodiments, the gate isolation structures 148 include dielectric material with dielectric constant value greater than 9, such as LaO, AlO, AlON, ZrO, HfO, ZnO, ZrN, ZrAlO, TiO, TaO, YO, and/or TaCN. In some embodiments, the deposition process is ALD, CVD (such as LPCVD, PECVD, HDP-CVD, or HARP), another suitable technique, or a combination thereof. Afterward, a planarization process is then performed on the dielectric material for the gate isolation structures 148 until the dielectric capping layer 146 and the first interlayer dielectric layer 132 are exposed, in accordance with some embodiments. The planarization may be CMP, etching back process, or a combination thereof.

Contact plugs 152 are formed in and/or through the first interlayer dielectric layer 132 and the contact etching stop layer 130 and land on the source/drain features 128N and 128P, as shown in FIGS. 3I-1, 3I-2 and 3I-4, in accordance with some embodiments. The contact plugs 152 are electrically connected to the source/drain features 128N and 128P, in accordance with some embodiments. In some embodiments, the formation of the contact plugs 152 includes patterning the first interlayer dielectric layer 132 and the contact etching stop layer 130 to form contact openings (where the contact plugs 152 are to be formed) using photolithography and etching processes until the source/drain features 128 are exposed. The etch process may include dry etching such as RIE, NBE, ICP etch, CCP etch, another suitable method, or a combination thereof. In some embodiments, the portions of the contact etching stop layer 130 formed along the gate spacer layers 120 are entirely removed, thereby exposing the sidewalls 120S2 of the gate spacer layers 120.

Silicide layers 150 are formed on the exposed surfaces of the source/drain features 128N and 128P. In some embodiments, the silicide layers 150 are made of WSi, NiSi, TiSi and/or CoSi. In some embodiments, the formation of the silicide layers 150 includes depositing a metal material followed by one or more annealing processes. The semiconductive material (e.g., Si) from the source/drain features 128N and 128P reacts with the metal material to form the silicide layers 150, in accordance with some embodiments.

Afterward, one or more conductive materials for the contact plugs 152 are deposited to overfill the contact openings, in accordance with some embodiments. In some embodiments, one or more conductive materials are deposited using CVD, PVD, e-beam evaporation, ALD, electroplating (ECP), electroless deposition (ELD), another suitable method, or a combination thereof to overfill the contact openings. The one or more conductive materials over the upper surface of the first interlayer dielectric layer 132 are planarized using, for example, CMP. After the planarization process, the upper surfaces of the contact plugs 152, the upper surface of the first interlayer dielectric layer 132 and the upper surfaces of the dielectric capping layers 146 are substantially coplanar, in accordance with some embodiments. In some embodiments, the contact plugs 152 are in contact with the sidewalls 120S2 of the gate spacer layers 120, and thus have a greater dimension in the X direction. Therefore, the contact plugs 152 may have a lower resistance (Rc), which may enhance the performance of the resulting semiconductor device.

The contact plugs 152 may have a multilayer structure including, for example, liner layers, glue layers, barrier layers, seed layers, metal bulk layers, another suitable layer, or a combination thereof. For example, a barrier layer (not shown) may optionally be deposited along the sidewalls and the bottom surfaces of the contact openings. The barrier layer is used to prevent the metal from the subsequently formed metal material from diffusing into the dielectric material (e.g., the first interlayer dielectric layer 132, and the contact etching stop layer 130). The barrier layer may be made of tantalum (Ta), tantalum nitride (TaN), titanium (Ti), titanium nitride (TiN), cobalt tungsten (CoW), another suitable material, or a combination thereof. If the subsequently formed metal material does not easily diffuse into the dielectric material, the barrier layer may be omitted.

A glue layer (not shown) may optionally be deposited along the sidewalls and the bottom surfaces of the contact openings, and on the barrier layer (if formed). The glue layer is used to improve adhesion between the subsequently formed metal material and the dielectric material (e.g., the first interlayer dielectric layer 132 and the contact etching stop layer 130). The glue layer may be made of tantalum nitride (TaN), titanium (Ti), titanium nitride (TiN), another suitable material, or a combination thereof.

A metal bulk layer is then deposited on the glue layer (if formed) to fill the remainder of the contact openings. In some embodiments, the metal bulk layer is formed using a selective deposition technique such as cyclic CVD process or ELD process, and it is not necessary to form a glue layer in the contact openings before depositing the metal bulk material. In some embodiments, the metal bulk layer is made of one or more conductive materials with low resistance and good gap-fill ability, for example, cobalt (Co), nickel (Ni), tungsten (W), titanium (Ti), tantalum (Ta), copper (Cu), rhodium (Rh), iridium (Ir), platinum (Pt), aluminum (Al), ruthenium (Ru), molybdenum (Mo), another suitable metal material, or a combination thereof.

A second interlayer dielectric layer 154 is formed over the semiconductor structure 100, as shown in FIGS. 3I-1 to 3I-5, in accordance with some embodiments. In some embodiments, the second interlayer dielectric layer 154 is made of dielectric material, such as USG, BPSG, FSG, PSG, BSG, and/or another suitable dielectric material. In some embodiments, the second interlayer dielectric layer 154 is deposited using such as CVD (such as HDP-CVD, PECVD, HARP or FCVD), another suitable technique, or a combination thereof.

Figures 1, 3I:
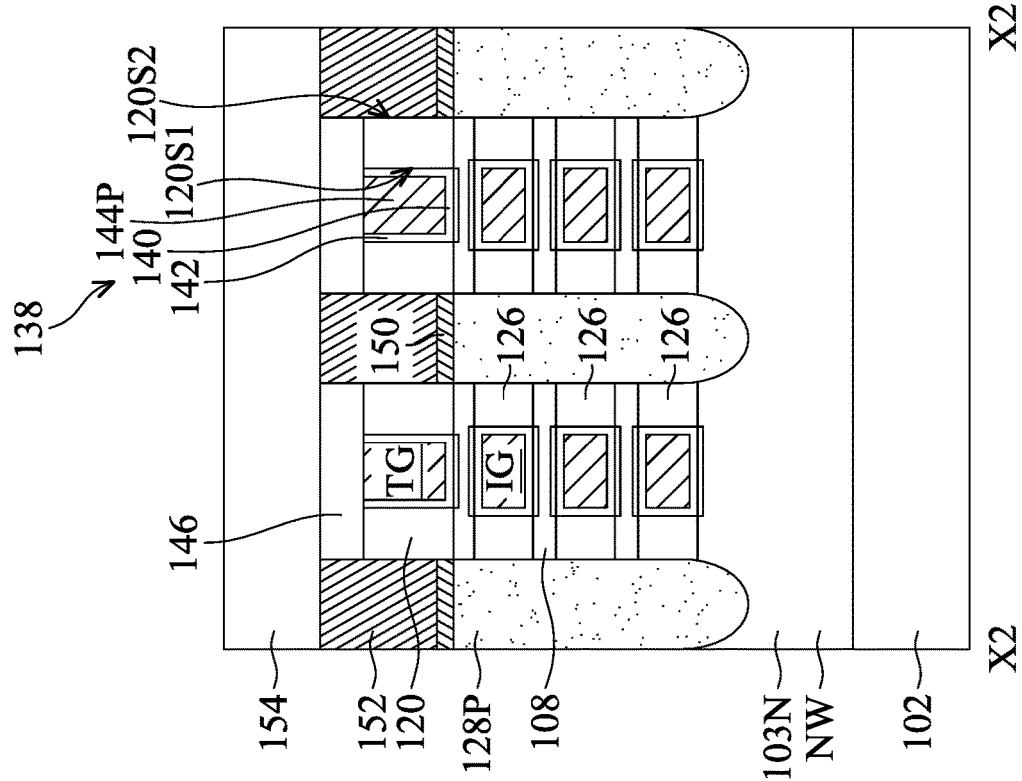
Figures 2, 3I:
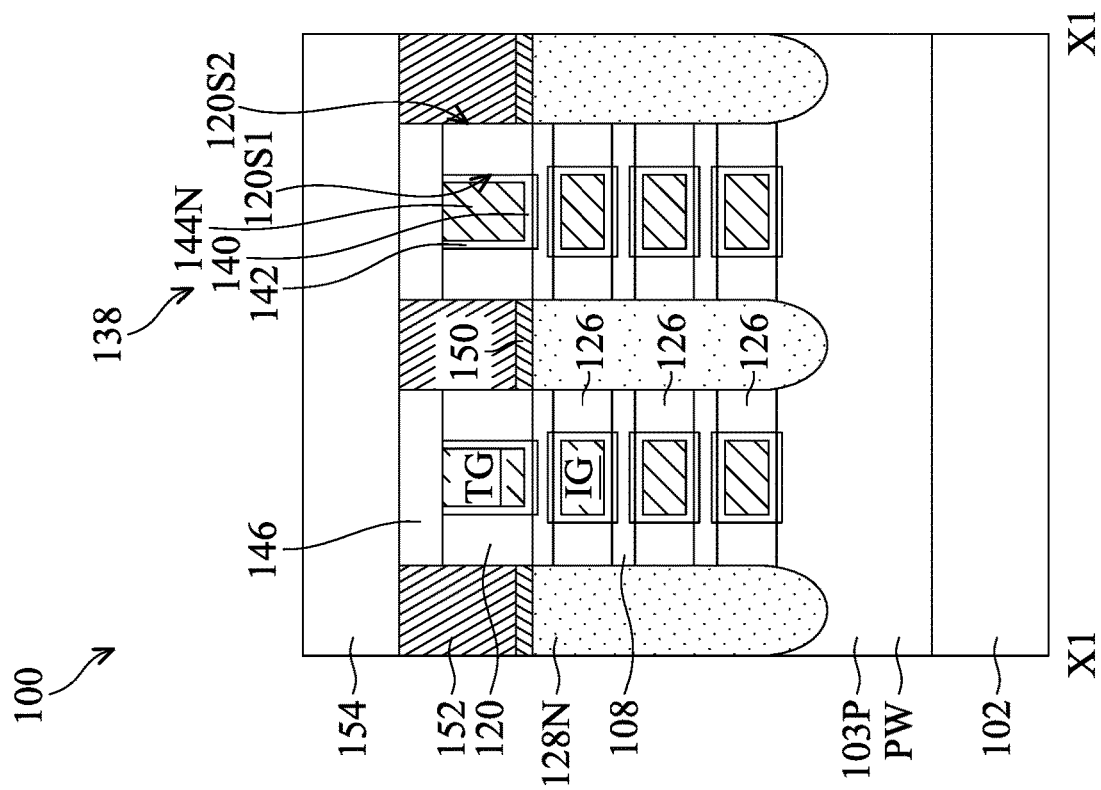
Figures 3, 3I, 4:
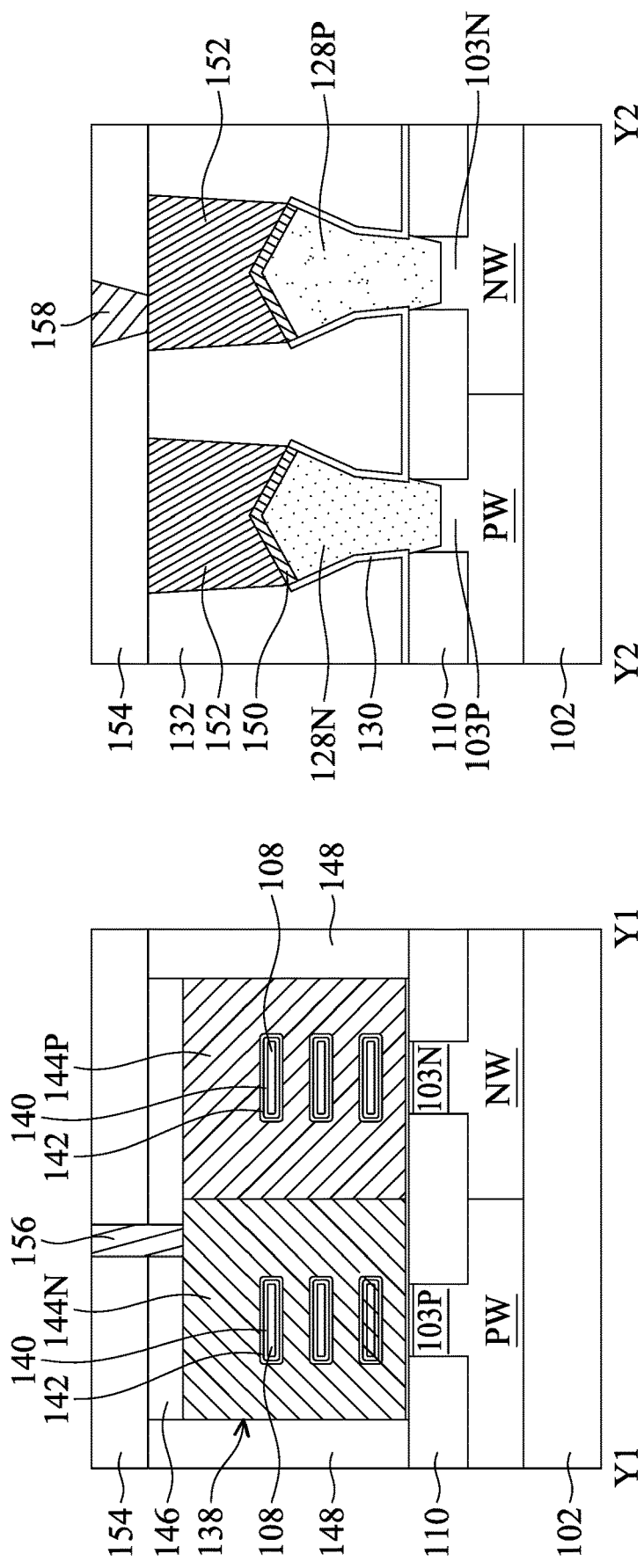
Figures 3, 3I, 4, 5:
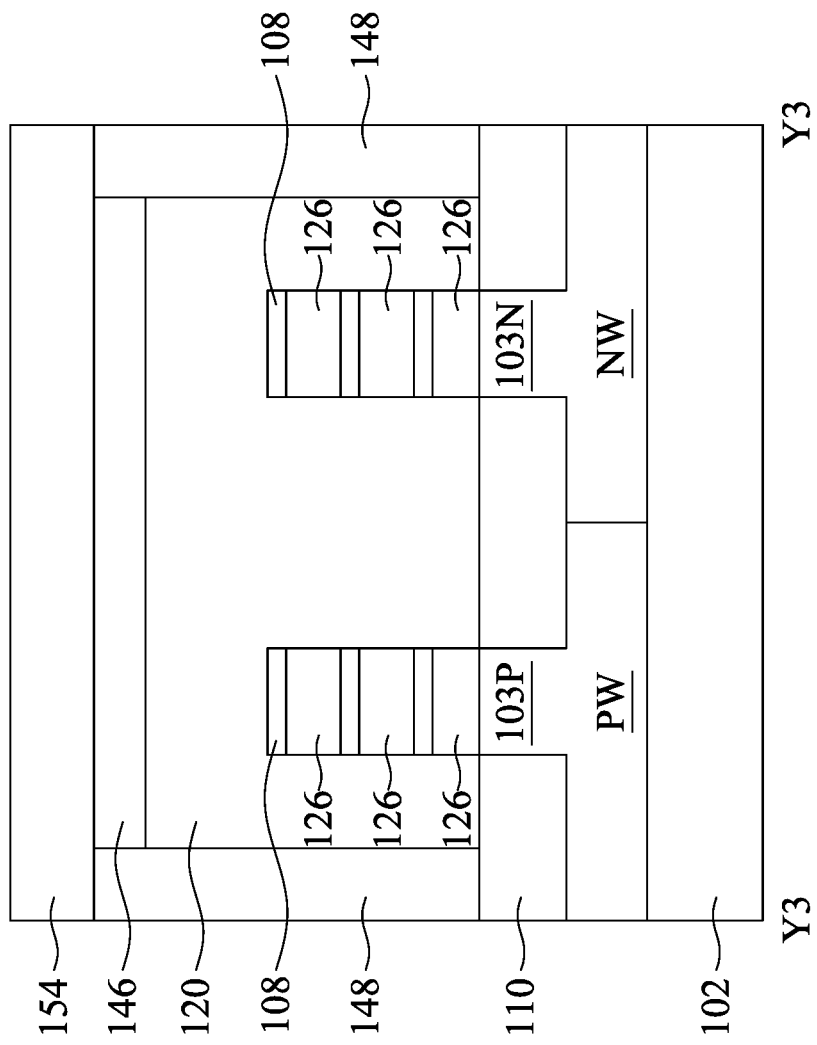
Figures 1, 2, 4:
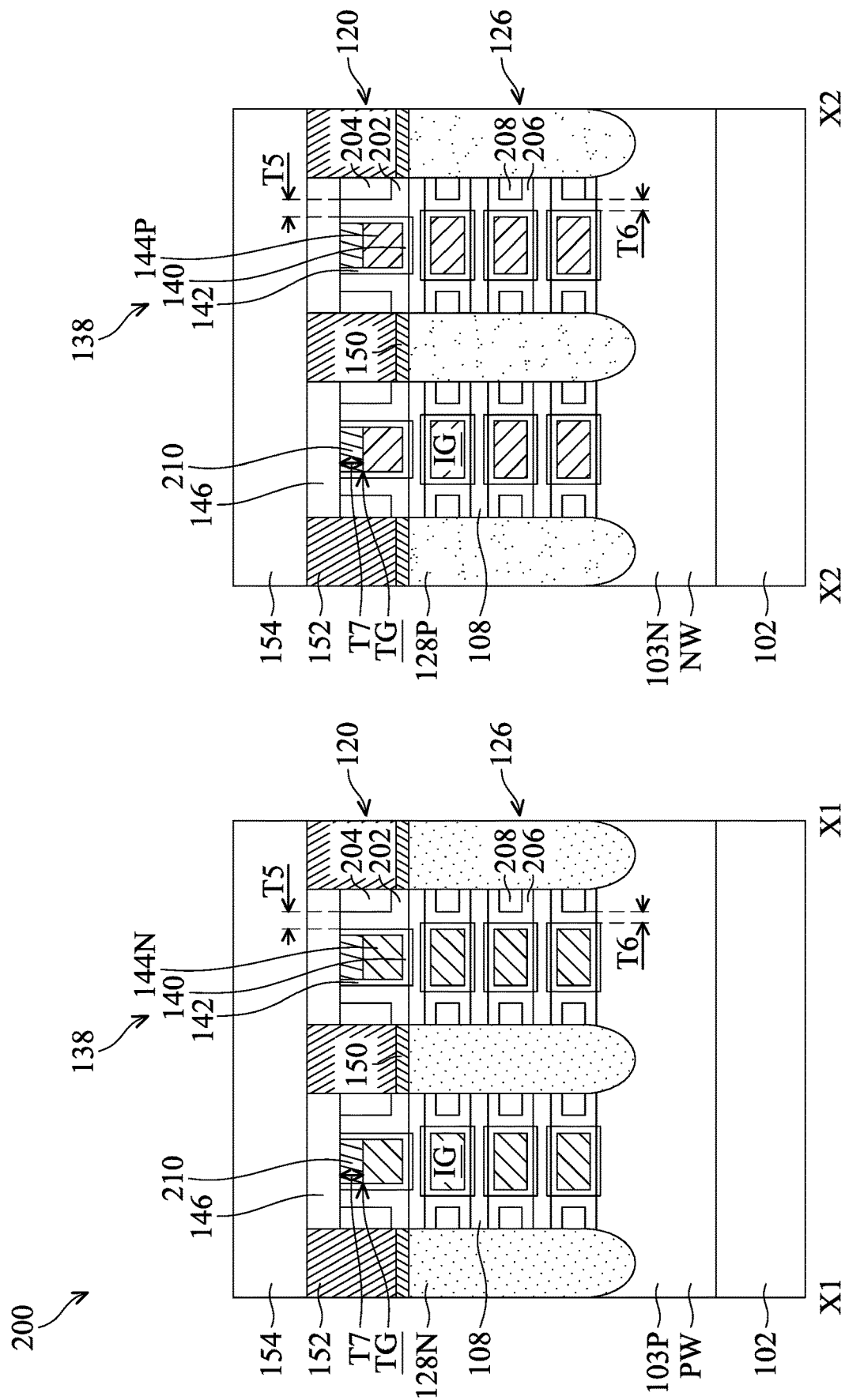
Figures 3, 4:
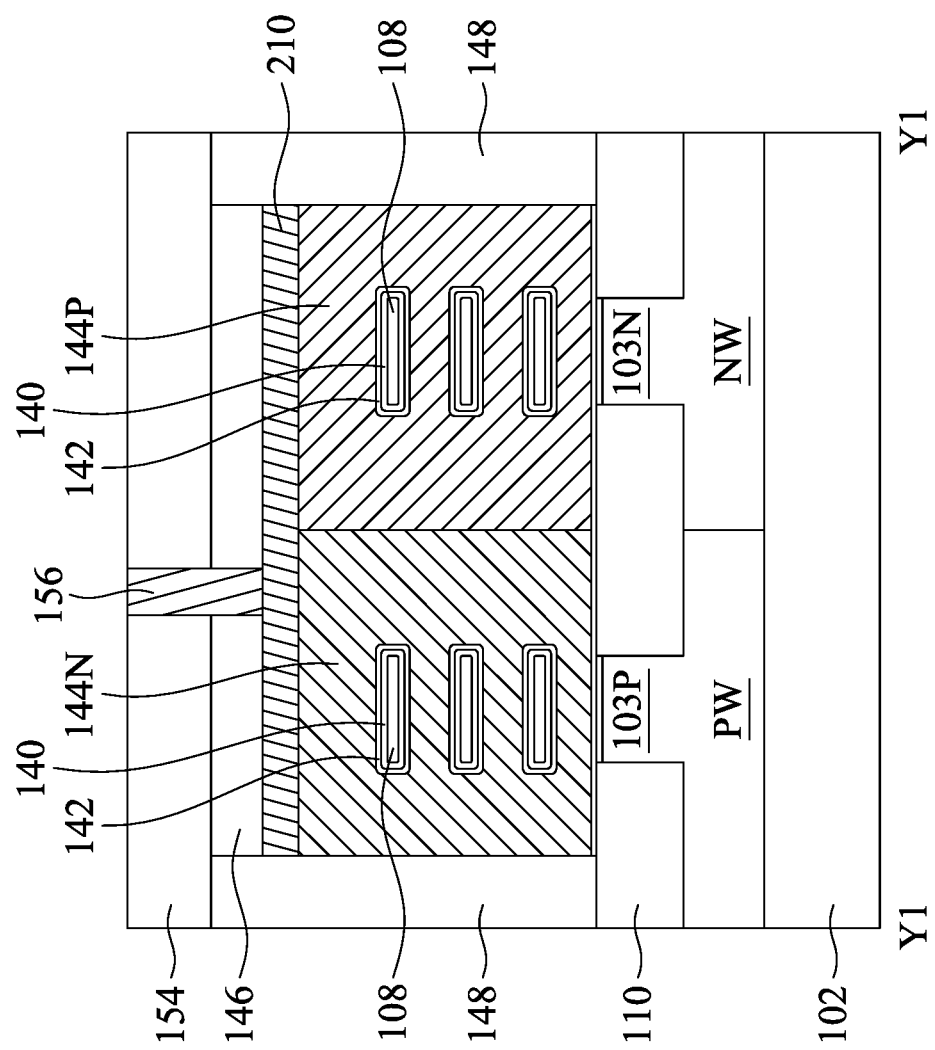
Figure 4:
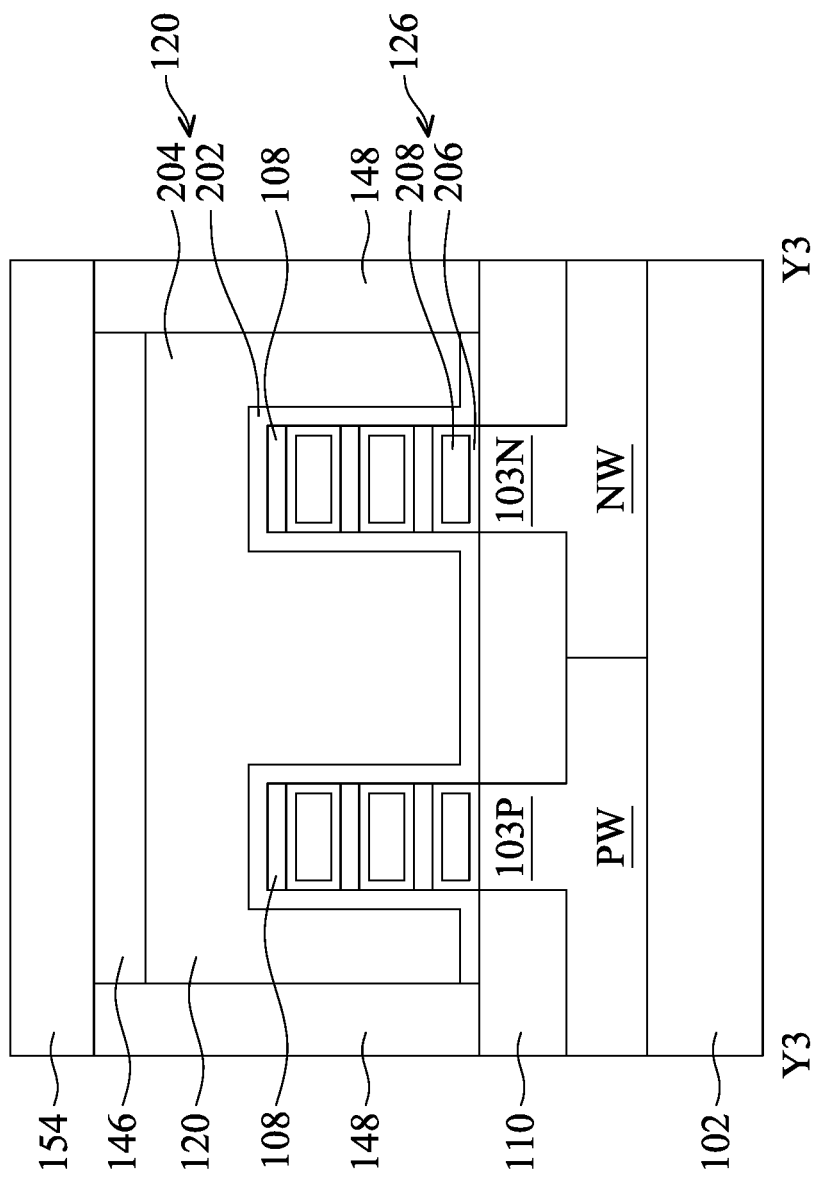

Vias 156 are formed in and/or through the second interlayer dielectric layer 154 and the dielectric capping layer 146 and land on the work function metal materials 144 of the final gate stacks 138, and vias 158 are formed in and/or through the second interlayer dielectric layer 154 and land on the contact plugs 152, as shown in FIGS. 3I-3 and 3I-4, in accordance with some embodiments. The vias 156 are electrically connected to the work function metal materials 144 of the final gate stacks 138 and may be also referred to as gate vias (VG), in accordance with some embodiments. The vias 158 are electrically connected to source/drain terminals of the nanostructure transistors through the contact plugs 152 and may be also referred to as source/drain vias (VS or VD), in accordance with some embodiments.

In some embodiments, the formation of the vias 156 and via 158 includes patterning the second interlayer dielectric layer 154 and the dielectric capping layer 146 to form via openings (where the vias 156 and via 158 are to be formed) using photolithography and etching processes. In some embodiments, the final gate stacks 138 are exposed from the via openings for vias 156, and the contact plugs 152 are exposed from the via openings for vias 158. The etch processes may include dry etching such as RIE, NBE, ICP etch, CCP etch, another suitable method, or a combination thereof. In some embodiments, the patterning processes for the vias 156 and via 158 may be formed separately. Afterward, one or more conductive materials are deposited using CVD, PVD, e-beam evaporation, ALD, ECP, ELD, another suitable method, or a combination thereof to overfill the via openings, in accordance with some embodiments. The one or more conductive materials over the upper surface of the second interlayer dielectric layer 154 are planarized using, for example, CMP. After the planarization process, the upper surfaces of the vias 156, the upper surfaces of the vias 158, and the upper surface of the second interlayer dielectric layer 154 are substantially coplanar, in accordance with some embodiments.

The vias 156 and via 158 may have a multilayer structure. For example, a barrier layer (not shown) may optionally be deposited along the sidewalls and the bottom surfaces of the via openings. The barrier layer may be made of tantalum (Ta), tantalum nitride (TaN), titanium (Ti), titanium nitride (TiN), cobalt tungsten (CoW), another suitable material, or a combination thereof. A glue layer (not shown) may optionally be deposited along the sidewalls and the bottom surfaces of the via openings, and on the barrier layer (if formed). The glue layer may be made of tantalum nitride (TaN), titanium (Ti), titanium nitride (TiN), another suitable material, or a combination thereof. A metal bulk layer is then deposited on the glue layer (if formed) to fill the remainder of the via openings. In some embodiments, the metal bulk layers are made of one or more conductive materials, such as cobalt (Co), nickel (Ni), tungsten (W), titanium (Ti), tantalum (Ta), copper (Cu), aluminum (Al), ruthenium (Ru), molybdenum (Mo), another suitable metal material, or a combination thereof.

It should be understood that the semiconductor structure 100 may undergo further CMOS processes to form various features over the semiconductor structure 100, such as a multilayer interconnect structure (e.g., metal lines, inter metal dielectric layers, passivation layers, etc.).

FIGS. 4-1, 4-2, 4-3 and 4-4 are a modification of the semiconductor structure 100 of FIGS. 3I-1, 3I-2 3I-3 and 3I-5 in accordance with some embodiments of the disclosure. FIG. 4-1 corresponds to cross-section X1-X1 shown in FIG. 2. FIG. 4-2 corresponds to cross-section X2-X2 shown in FIG. 2. FIG. 4-3 corresponds to cross-section Y1-Y1 shown in FIG. 2. FIG. 4-4 corresponds to cross-section Y3-Y3 shown in FIG. 2. FIGS. 4-1, 4-2, 4-3 and 4-4 illustrate a semiconductor 200 which is similar to the semiconductor structure 100 of FIGS. 3I-1, 3I-2 3I-3 and 3I-5 except the gate spacer layers, the inner spacer layers and the top gate electrode layers.

The gate spacer layers 120 are bi-layer structure which include a first gate spacer layer 202 and a second gate spacer layer 204 formed over the first gate spacer layer 202, as shown in FIGS. 4-1, 4-2 and 4-4, in accordance with some embodiments. In some embodiments, the first gate spacer layer 202 and the second gate spacer layer 204 are made of a dielectric material, such as silicon oxide ($SiO_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof, or a combination thereof. In some embodiments, the gate spacer layer 202 and the gate spacer layer 204 are made of different materials and have different dielectric constant values. For example, the first gate spacer layer 202 is a SiOCN layer and the second gate spacer layer 204 is a Si(O)CN layer. The oxygen concentration in the SiOCN layer may be greater than the oxygen concentration in the Si(O)CN layer.

The inner spacer layers 126 are bi-layer structure which include a first inner spacer layer 206 and a second inner spacer layer 208 formed over the first inner spacer layer 206, as shown in FIGS. 4-1, 4-2 and 4-4, in accordance with some embodiments. In some embodiments, the first inner spacer layer 206 and the second inner spacer layer 208 are made of dielectric material, such as silicon oxide (SiO$_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). For example, the first inner spacer layer 206 is a SiOCN layer and the second inner spacer layer 208 is a Si(O)CN layer.

In some embodiments, the first gate spacer layer 202 has a thickness T5 (in the X direction) along the final gate stack 138. In some embodiments, the first inner spacer layer 206 has a thickness T6 (in the X direction) along the along the final gate stack 138. In some embodiments, the thickness T5 of the first gate spacer layer 202 is greater than the thickness T6 of the first inner spacer layer 206.

The top gate electrode layers TG further includes a low-resistivity metal material 210 over the work function metal material 144N and 144P, as shown in FIGS. 4-1, 4-2 and 4-3, in accordance with some embodiments. The low-resistivity metal material 210 continuously extends over the n-type well NW and the p-type well PW, in accordance with some embodiments. In some embodiments, the via 156 lands on the low-resistivity metal material 210. In some embodiments, the low-resistivity metal material 210 has lower electrical conductivity resistivity than that of the work function metal material 144N and 144P, which may reduce the overall resistance of the gate electrode layer, in accordance with some embodiments.

In some embodiments, the low-resistivity metal material 210 includes tungsten (W), copper (Cu), ruthenium (Ru), or a combination thereof. In some embodiments, after forming the work function metal materials 144, an etching back process may be performed on the work function metal materials 144 to form recesses which is located between the portions of the gate dielectric layer 142 along the gate spacer layers 120, and then low-resistivity metal material 210 is deposited to overfill the recesses. A planarization process such as CMP may be performed on the low-resistivity metal material 210 to remove the low-resistivity metal material 210 above the upper surface of the first interlayer dielectric layer 132, in accordance with some embodiments. As a result, the combination of the metal materials of the inner gate electrode layers IG is different than the combination of the metal materials of the top gate electrode layers TG, in accordance with some embodiments. In some embodiments, the low-resistivity metal material 210 has a thickness T7 in the Z direction. The thickness T7 is in a range from about 2 nm to about 20 nm such as about 4 nm to about 12 nm.

As described above, the aspect of the present disclosure is directed to a semiconductor structure including nanostructure transistors. The semiconductor structure includes a set of nanostructures 108, a top gate electrode layer TG above the topmost nanostructure 108, and an inner gate electrode layer IG between the nanostructures 108, in accordance with some embodiments. The gate length L3 of the top gate electrode layer TG is shorter than the gate length L4 of the inner gate electrode layer IG, in accordance with some embodiments. As a result, the top gate electrode layers TG have a relatively short gate length L3, which may improve the density of components of the semiconductor devices. The inner gate electrode layers IG have a relatively long gate length L4, which may enhance the performance of the resulting semiconductor device, e.g., lower gate leakage, and/or lower off-state current (Isoff).

Embodiments of a semiconductor structure and the method for forming the same may be provided. The method for forming a semiconductor structure may include forming a dummy gate structure and a top spacer layer across an active region. The active region extends in a first direction and includes alternately stacking first semiconductor layers and second semiconductor layers. The method further includes laterally etching the first semiconductor layers to form notches directly below the gate spacer layer, and forming inner spacer layers in the notches. The thickness of the gate spacer layer in the first direction is greater than the thickness of the inner spacer layers in the first direction. As a result, the top spacer layer has a relatively thick thickness, which may reduce the parasitic capacitance and improve the breakdown voltage. The inner spacer layers have a relatively thin thickness, which may increase the on-state current (Ion). Therefore, the performance and the reliability of the resulting semiconductor device are enhanced.

In some embodiments, a method for forming a semiconductor structure is provided. The method includes forming an active region over a substrate. The active region extends in a first direction and includes alternately stacking first semiconductor layers and second semiconductor layers. The method further includes forming a dummy gate structure across the active region, forming a gate spacer layer alongside the dummy gate structure, etching the active region to form a source/drain recess, and laterally etching the first semiconductor layers to form notches. The notches have a first dimension in the first direction, the gate spacer layer has a second dimension in the first direction, and the first dimension is less than the second dimension. The method further includes forming inner spacer layers in the notches, and forming a source/drain feature in the source/drain recess.

In some embodiments, a method for forming a semiconductor structure is provided. The method includes forming an active region over a substrate. The active region includes alternately stacking first semiconductor layers and second semiconductor layers. The method further includes forming a dummy gate structure and a gate spacer layer over the active region, forming inner spacer layers on sidewalls of the first semiconductor layers between the second semiconductor layers, removing the dummy gate structure to form a gate trench, and removing the first semiconductor layers to form gaps. A first dimension of the gate trench in a first direction is shorter than a second dimension of the gaps in the first direction.

In some embodiments, a semiconductor structure is provided. The semiconductor structure includes a first set of nanostructures vertically stacked and spaced apart from one another and in a first well, a source/drain feature adjoining the first set of nanostructures, a first top gate electrode layer above a topmost nanostructure in the first set of nanostructures, and an inner gate electrode layer sandwiched between the nanostructures. A first dimension of the inner gate electrode layer in a first direction is greater than a second dimension of the first top gate electrode layer in the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming an active region over a substrate, wherein the active region extends in a first direction and comprises alternately stacked first semiconductor layers and second semiconductor layers;
   forming a dummy gate structure across the active region;
   forming a gate spacer layer alongside the dummy gate structure;
   etching the active region to form a source/drain recess;
   laterally etching the first semiconductor layers to form notches, wherein:
      the notches have a first dimension in the first direction,
      the gate spacer layer has a second dimension in the first direction, and
      the first dimension is less than the second dimension;
   forming inner spacer layers in the notches;
   forming a source/drain feature in the source/drain recess;
   removing the dummy gate structure to form a trench;
   removing the first semiconductor layers of the active region to form gaps, wherein the second semiconductor layers of the active region form a set of nanostructures, and
   forming a gate electrode layer in the trench and the gaps, comprising:
      depositing a first conductive material to fill the trench and the gaps;
      recessing a portion of the first conductive material in the trench; and
      depositing a second conductive material over the portion of the first conductive material in the trench, wherein a resistivity of the second conductive material is lower than a resistivity of the first conductive material.

2. The method for forming the semiconductor structure as claimed in claim 1, wherein:
   the dummy gate structure has a third dimension in the first direction,
   after laterally etching the first semiconductor layers to form the notches, the first semiconductor layers have a fourth dimension in the first direction, and
   the fourth dimension is greater than the third dimension.

3. The method for forming the semiconductor structure as claimed in claim 1, wherein:
   a first portion of the gate electrode layer in the trench has a third dimension in the first direction,
   a second portion of the gate electrode layer in the gaps has a fourth dimension in the first direction, and
   the third dimension is less than the fourth dimension.

4. The method for forming the semiconductor structure as claimed in claim 3, wherein a ratio of the fourth dimension to the third dimension is in a range from about 1.05 to about 1.3.

5. The method for forming the semiconductor structure as claimed in claim 1, further comprising, before forming the gate electrode layer:
   oxidizing the set of nanostructures to form an interfacial layer, wherein:
      the interfacial layer wraps around the set of nanostructures,
      the interfacial layer comprises a first portion on a top surface of a topmost nanostructure in the set of nanostructures and a second portion on a bottom surface of the topmost nanostructure, and
      the first portion of the interfacial layer is shorter than the second portion of the interfacial layer.

6. The method for forming the semiconductor structure as claimed in claim 1, wherein:
   the active region comprises a lower fin element,
   the first semiconductor layers and the second semiconductor layers are alternately stacked over the lower fin element, and
   the source/drain recess extends into the lower fin element.

7. The method for forming the semiconductor structure as claimed in claim 1, further comprising:
   forming an interlayer dielectric layer over the source/drain feature; and
   forming a contact plug through the interlayer dielectric layer and over the source/drain feature, wherein the contact plug is in contact with the gate spacer layer.

8. A method for forming a semiconductor structure, comprising:
   forming an active region over a substrate, wherein the active region comprises alternately stacked first semiconductor layers and second semiconductor layers;
   forming a dummy gate structure and a gate spacer layer over the active region, wherein forming the gate spacer layer comprises:
      depositing a first dielectric material; and
      depositing a second dielectric material over the first dielectric material;
   forming inner spacer layers on sidewalls of the first semiconductor layers between the second semiconductor layers, wherein forming the inner spacer layers comprises:
      depositing a third dielectric material; and
      depositing a fourth dielectric material over the third dielectric material, wherein the third dielectric material is thinner than the first dielectric material;
   removing the dummy gate structure to form a gate trench; and
   removing the first semiconductor layers to form gaps, wherein a first dimension of the gate trench in a first direction is shorter than a second dimension of the gaps in the first direction.

9. The method for forming the semiconductor structure as claimed in claim 8, wherein in a cross-sectional view, a topmost second semiconductor layer in the second semiconductor layers has a bottom surface exposed from one of the gaps and a top surface covered by the gate spacer layer.

10. The method for forming the semiconductor structure as claimed in claim 8, wherein:
    the gate spacer layer comprises a first portion formed over a top surface of the active region,
    the first portion of the gate spacer layer is exposed from the gate trench, and
    the inner spacer layers are exposed from the gaps.

11. The method for forming the semiconductor structure as claimed in claim 10, wherein:
    the gate spacer layer comprises a second portion formed along a sidewall of the active region, and
    in a cross-sectional view, the second portion of the gate spacer layer is exposed from the gaps.

12. The method for forming the semiconductor structure as claimed in claim 8, further comprising:
    etching a portion of the active region using the dummy gate structure and the gate spacer layer as a mask to form a recess, wherein a bottom surface of the recess is curved; and
    forming a source/drain feature in the recess.

13. The method for forming the semiconductor structure as claimed in claim 8, comprising:

forming a gate electrode layer in the gate trench and the gaps.

14. A semiconductor structure, comprising:
a first set of nanostructures vertically stacked and spaced apart from one another and over a first well;
a second set of nanostructures vertically stacked and spaced apart from one another and over a second well, wherein the first well and the second well have different conductivity types;
a source/drain feature adjoining the first set of nanostructures;
a first top gate electrode layer above a topmost nanostructure in the first set of nanostructures, wherein the first top gate electrode layer comprises a first work function metal material and a low-resistivity metal material over the first work function metal material;
a second top gate electrode layer above a topmost nanostructure in the second set of nanostructures, wherein:
the second top gate electrode layer comprises a second work function metal material and the low-resistivity metal material over the second work function metal material,
the second work function metal material is different than the first work function metal material, and
the low-resistivity metal material extends continuously over the first well and the second well; and
an inner gate electrode layer sandwiched between the nanostructures of the first set of nanostructures, wherein a first dimension of the inner gate electrode layer in a first direction is greater than a second dimension of the first top gate electrode layer in the first direction.

15. The semiconductor structure as claimed in claim 14, further comprising:
a contact plug over the source/drain feature, wherein a first distance between the first top gate electrode layer and the contact plug is greater than a second distance between the inner gate electrode layer and the source/drain feature.

16. The semiconductor structure as claimed in claim 14, further comprising:
a top spacer layer alongside the first top gate electrode layer and above the topmost nanostructure in the first set of nanostructures; and
inner spacer layers alongside the inner gate electrode layer and sandwiched between the nanostructures of the first set of nanostructures, wherein the inner spacer layers have a lower dielectric constant than the top spacer layer.

17. The semiconductor structure as claimed in claim 14, wherein:
the first top gate electrode layer comprises a first conductive material and a second conductive material over the first conductive material, and
a resistivity of the second conductive material is lower than a resistivity of the first conductive material.

18. The semiconductor structure as claimed in claim 14, comprising:
an interfacial layer wrapping around the first set of nanostructures.

19. The semiconductor structure as claimed in claim 18, wherein:
the interfacial layer comprises a first portion on a top surface of the topmost nanostructure in the first set of nanostructures and a second portion on a bottom surface of the topmost nanostructure in the first set of nanostructures, and
the first portion of the interfacial layer is shorter than the second portion of the interfacial layer.

20. The semiconductor structure as claimed in claim 14, comprising:
an interlayer dielectric layer over the source/drain feature; and
a contact plug extending through the interlayer dielectric layer and over the source/drain feature.

* * * * *